United States Patent
Ishidai et al.

(10) Patent No.: US 8,962,364 B2
(45) Date of Patent: Feb. 24, 2015

(54) PRODUCTION METHOD FOR ORGANIC ELECTROLUMINESCENT ELEMENT

(75) Inventors: Hiroshi Ishidai, Hachioji (JP); Tomoyuki Nakayama, Hino (JP); Shun Furukawa, Machida (JP)

(73) Assignee: Konica Minolta Holdings, Inc. (JP)

( * ) Notice: Subject to any disclaimer, the term of this patent is extended or adjusted under 35 U.S.C. 154(b) by 214 days.

(21) Appl. No.: 13/634,380

(22) PCT Filed: Feb. 28, 2011

(86) PCT No.: PCT/JP2011/054460
§ 371 (c)(1),
(2), (4) Date: Sep. 12, 2012

(87) PCT Pub. No.: WO2011/114870
PCT Pub. Date: Sep. 22, 2011

(65) Prior Publication Data
US 2013/0011951 A1 Jan. 10, 2013

(30) Foreign Application Priority Data
Mar. 16, 2010 (JP) .................. 2010-059009

(51) Int. Cl.
H01L 51/56 (2006.01)
H01L 51/00 (2006.01)
H05B 33/10 (2006.01)
H01L 51/50 (2006.01)

(52) U.S. Cl.
CPC ........ *H01L 51/0003* (2013.01); *H01L 51/0026* (2013.01); *H05B 33/10* (2013.01); *H01L 51/0037* (2013.01); *H01L 51/50* (2013.01); *H01L 51/0072* (2013.01); *H01L 51/0085* (2013.01)
USPC .................. 438/46; 438/99; 257/E51.018

(58) Field of Classification Search
None
See application file for complete search history.

(56) References Cited

U.S. PATENT DOCUMENTS

| | | | |
|---|---|---|---|
| 8,039,040 B2 * | 10/2011 | Takeda et al. | 427/66 |
| 8,349,392 B2 * | 1/2013 | Miura et al. | 427/58 |
| 8,456,078 B2 * | 6/2013 | Hashimoto | 313/504 |
| 2008/0213621 A1 * | 9/2008 | Takashima et al. | 428/690 |
| 2009/0074974 A1 * | 3/2009 | Yokoi et al. | 427/335 |
| 2009/0267507 A1 * | 10/2009 | Takashima et al. | 313/511 |
| 2011/0042691 A1 * | 2/2011 | Hayata et al. | 257/88 |
| 2012/0100667 A1 * | 4/2012 | Koutake et al. | 438/99 |

FOREIGN PATENT DOCUMENTS

| | | |
|---|---|---|
| JP | 8-306954 A | 11/1996 |
| JP | 2003-297578 A | 10/2003 |
| JP | 2004-330507 A | 11/2004 |
| JP | 2005-26000 A | 1/2005 |
| JP | 2005-62594 A | 3/2005 |
| JP | 2006-294536 A | 10/2006 |
| WO | 2007/052431 A1 | 5/2007 |

OTHER PUBLICATIONS

International Search Report for International Application No. PCT/JP2011/054460 mailing date of Mar. 29, 2011 with English Translation.

* cited by examiner

*Primary Examiner* — Savitr Mulpuri
(74) *Attorney, Agent, or Firm* — Cantor Colburn LLP

(57) ABSTRACT

Disclosed is a production method for an organic electroluminescent element that is provided with a substrate, an organic laminate with an organic light emitting layer that was formed by a method involving a wet process, and a pair of electrodes, wherein the method produces an organic electroluminescent element with high luminous efficiency, low driving voltage, and a minimal rise in voltage when continuously driven, by applying the coating liquid for said organic light emitting layer, and thereafter, in a drying process, heating the substrate while applying tension in a manner such that a stress that is less than the yield stress is applied to the substrate.

7 Claims, No Drawings

PRODUCTION METHOD FOR ORGANIC ELECTROLUMINESCENT ELEMENT

CROSS REFERENCE TO RELATED APPLICATIONS

This is a U.S. national stage of application No. PCT/JP2011/054460, filed on 28 Feb. 2011. Priority under 35 U.S.C. §119(a) and 35 U.S.C. §365(b) is claimed from Japanese Application No. 2010-059009, filed 16 Mar. 2010, the disclosure of which are also incorporated herein by reference.

TECHNICAL FIELD

The present invention relates to a production method of an organic electroluminescence element produced by a method containing a wet process. In particular, the present invention relates to a production method of an organic electroluminescence element exhibiting a high light emitting efficiency with a low driving voltage and having a long lifetime with small increase of driving voltage after a prolonged continued driving.

BACKGROUND

It is known an electroluminescence device (hereinafter, referred to as an ELD) as an emission type electronic device. As a composing element of an ELD, there are cited an inorganic electroluminescence element (hereinafter, referred to as an inorganic EL element) and an organic electroluminescence element (hereinafter, referred to as an organic EL element). An inorganic EL element has been utilized mainly as a flat light source, however, it requires a high voltage of alternating current to drive an emission element.

On the other hand, an organic electroluminescence element has a structure comprising a light emitting layer containing a light emitting substance being sandwiched with a cathode and an anode, and an exciton is generated by an electron and a hole being injected into the light emitting layer to be recombined. The element emits light by utilizing light release (fluorescence or phosphorescence) at the time of deactivation of the exciton. The light emission is possible at a voltage of approximately a few to a few tens volts, and an organic EL element is attracting attention with respect to such as wide viewing angle and high visual recognition due to a self-emission type as well as space saving and portability due to a completely solid element of a thin layer type.

Moreover, an organic EL device has a distinctive feature of being a surface light, which is different from the main light sources, for example, a light-emitting diode and a cold cathode tube having been conventionally used. As applications which can effectively utilize this property, there are a light source for illumination and a back light of various displays. Especially, it is suitable to use as a back light of a full color liquid crystal display the demand of which has been increased remarkably in recent years.

When an organic EL element is used as a back light of a display or a light source for illumination as described above, there are required to have high light emission efficiency. For improvement in light emission efficiency, it is becoming general to use what is called a host-guest type in which a plurality of materials each respectively have an individual function are mixed for constituting an organic light emitting layer which composes an organic electroluminescence element.

As a production method of an organic electroluminescence element, although there are known a vapor-depositing method, a wet process (for example, a spin coat method, a cast method, an ink-jet method, a spray method and a printing method) (hereinafter, it is also called as a coating method), a production method by a wet process has been attracting attention in recent years for the reason that continuous production is easy and a vacuum process is not needed.

However, an organic EL element produced with a wet process will not exhibit sufficient performance compared with an element produced with a vapor-depositing method. In particular, it has a tendency of increased driving voltage and increased voltage at the time of continued driving.

In the past, the following technology was disclosed as a means which raises the performance of an organic light emitting layer of an organic EL element produced with a wet process those performance is inferior to an element produced with a vapor-depositing method. This technology gave polarization nature to the light source itself, and aimed at improvement in luminosity by applying orientation treatment with a rubbing processing to a nt-conjugated type polymer (refer to Patent document 1).

However, by the method described in this Patent-document 1, there occurred a problem that a film layer was cracked or a film layer was scraped off due to the process by which the formed very thin film was contacted directly.

On the other hand, there was disclosed a technology of reducing the remaining solvent and increasing an adhesive property of an organic light emitting layer to an adjacent layer. This technology contains to apply heat and pressure around the organic light emitting layer with the pressure larger than the atmospheric pressure at the time of formation, or after formation of the organic light emitting layer (for example, Patent document 2). However, it is necessary to heat at a temperature higher than Tg of a composing material of an organic light emitting layer composition in this method. When it is required to use a material having a high Tg, the heating temperature becomes high, and Tg of the substrate has to be made high. There was a problem of difficulty in keeping the flexibility nature enabling to produce an organic electroluminescence element with a curved surface, which is one of the features of an organic electroluminescence element.

Moreover, there was disclosed a technology to improve a light extraction efficiency (it is also called as "an external extraction quantum efficiency") by forming an organic light emitting layer with a coating method, and then, by stretching it to make oriented the material in the organic light emitting layer (for example, Patent document 3). However, the layer will be destroyed, if the organic light emitting layer is stretched after being coated.

In addition, there was disclosed a technology in which a specific phosphorescence compound is used to make an element to have a specific film density range with a predetermined upper limit and a predetermined lower limit. It is indicated that a voltage increase after a prolonged driving under a constant current and generating of a dark spot are controlled, and the stability of the element with the passage of time under high temperature and high humidity can be improvable (for example, Patent document 4). In the aforesaid Patent document, although the specific numerical value of the film density at the time of using a specific compound is mentioned, it is not considered at all the difference of the film density by changing the production method.

PRIOR TECHNOLOGICAL DOCUMENTS

Patent Documents

Patent document 1: JP-A No. 8-306954
Patent document 2: JP-A No. 2005-26000

Patent document 3: JP-A No. 2003-297578
Patent document 4: WO 2007/052431

SUMMARY OF THE INVENTION

Problems to be Solved by the Invention

The present invention was achieved in view of the above-mentioned problems. By using a production method of electroluminescence containing a wet process, although the production efficiency being high, the performance of the element being inferior, an object of the present invention is to provide a production method of an organic electroluminescence element exhibiting a high light emitting efficiency with a low driving voltage and having a long lifetime with small increase of driving voltage after a prolonged continued driving.

Means to Solve the Problems

An object of the present invention described above has been achieved by the following constitutions.
1. A producing method of an organic electroluminescence element having a substrate, an organic laminated body containing an organic light emitting layer which is produced with a wet process, and a pair of electrodes, the producing method comprising the steps of:
    applying a coating solution of the organic light emitting layer to the substrate, thereafter
    drying the organic light emitting layer by heating the substrate while applying a tension to the substrate in a manner that a stress of less than a yield stress of the substrate is given to the substrate.
2. The producing method of an organic electroluminescence element of the aforesaid item 1,
    wherein the drying step contains a constant rate drying step and a decreasing rate drying step, the tension is not given to the substrate during the constant rate drying step, and the tension is given to the substrate during the decreasing rate drying step in a manner that a stress of less than a yield stress of the substrate is given to the substrate.

An organic light emitting layer produced with a wet process exhibits a small amount of external extraction quantum efficiency, a high driving voltage and a high increase of driving voltage after a prolonged continued driving. The reasons of them are thought to be as follows: the film produced with a wet process will produce mixture between layers, or will produce a morphology change of the film, and since the condition of the film is different from the film produced with a dry process, there is inhibition of carrier transport.

Moreover, there is a remaining solvent inside of the film, and the remaining solvent in the film may function as a trap ingredient which inhibits transfer of a carrier at the time of driving. As a result, it is thought that a voltage rise tendency will become increased.

Moreover, since the inside of the layer will be in the state of the excess of a carrier as a result of carrying out the trap of the carrier, degradation may be promoted, a carrier trap will be increased and the voltage may be increased at the time of a continuous driving.

By heating while applying a tension to the substrate, the film density will be increase after the tension is released. As a result, it is thought that the trap of a carrier will be decreased. In addition, by not giving the tension to the substrate during the constant rate drying step, and by giving the tension to the substrate during the decreasing rate drying step, the structure of the material which constitutes the organic light emitting layer will be shaken. The solvent which remains in the organic light emitting layer will easily evaporate, and it is thought that the amount of the remaining solvents will be decreased.

3. The producing method of an organic electroluminescence element of the aforesaid items 1 or 2,
    wherein the tension to the substrate is applied in two axis directions.
4. The producing method of an organic electroluminescence element of any one of the aforesaid items 1 to 3,
    wherein the applied tension is in the range of 0.01 N/m to 50 N/m.
5. The producing method of an organic electroluminescence element of any one of the aforesaid items 1 to 3,
    wherein the stress is 0.33 to 165 kPa.
6. The producing method of an organic electroluminescence element of any one of the aforesaid items 1 to 5,
    wherein a film density (A) of the organic light emitting layer and a film density (B) of a layer produced by vapor depositing the same material used for the organic light emitting layer satisfy the following scheme.

$$-0.02 \text{ g/cm}^3 \leq (B)-(A) \leq 0.15 \text{ g/cm}^3$$

7. The producing method of an organic electroluminescence element of any one of the aforesaid items 1 to 5,
    wherein a film density (A) of the organic light emitting layer and a film density (B) of a layer produced by vapor depositing the same material used for the organic light emitting layer satisfy the following scheme.

$$-0.02 \text{ g/cm}^3 \leq (B)-(A) \leq 0.06 \text{ g/cm}^3$$

8. The producing method of an organic electroluminescence element of any one of the aforesaid items 1 to 7,
    wherein the substrate contains a material which exhibits flexibility.

If a substrate contains a material which has a flexible property, after heating while applying a tension to the substrate, it is considered that an increase of the film density will be large when the tension is released, and a diminution of a carrier trap will be large. Moreover, it is thought that shaking of the coated layer will be increased since the deformation when applying a tension is large, and evaporation of a solvent becomes easy.

Effects of the Invention

By the present invention, it is possible to provide an organic EL element which shows a small amount of voltage increase at the time of continued driving as well as a high luminescence efficiency and a low driving voltage.

EMBODIMENTS TO CARRY OUT THE INVENTION

Hereafter, although the details of each constituent element of an organic EL element of the present invention will be explained successively, the present invention is not limited to these.

In the present invention, it is characterized by the following in the production method of an organic EL element having an organic light emitting layer on a substrate: at least an organic light emitting layer is produced by a method including a wet process, and in a drying process of the organic light emitting layer, and it is heated while applying a tension to the substrate.

It is supposed that an organic EL element having an organic light emitting layer produced with the above-mentioned production method can reduce the chance of recombination of a hole and an electron by increasing a film density. Otherwise, it is supposed that the morphology of the film becomes similar to that of the film produced with a vacuum deposition method.

<<Wet Process>>

In the present invention, it is preferable to use a coating method such as: a spin coat method, a die coat method, an ink-jet method and a printing method, from the viewpoints of obtaining a uniform film and hardly producing a pinhole.

When a wet process is employed, it is preferable that the solvent after coating is removed as much as possible. It is possible to pass through a drying process. As a drying process, preferable methods are a heat drying method, a reduced pressure drying method and a heat-reduced pressure drying method. In particular, when a flexible substrate such as a resin is employed, the substrate may be deteriorated at too high temperature. Therefore, it is preferable to use a drying method in combination with a reduced pressure.

<<Drying Process>>

The above-described drying process can be divided into a constant rate drying step carried out in the initial stage of the drying process and a decreasing rate drying step carried out in the later stage of the drying process. In the constant rate drying step, a sufficient amount of solvent is present on the coated layer surface, and the temperature of the surface will be constant value if the drying condition is constant. When the amount of the solvent on the surface becomes small in proportion to progress of drying, the temperature of the surface will begin to rise and the drying will enter in the decreasing rate drying step <<Heating>>

The above-mentioned organic light emitting layer passes through a heating step while applying a tension after coating.

A preferable heating temperature is from 80° C. to 160° C., and when a resin substrate exhibiting flexibility is employed, the heating temperature is preferably 140° C. or less, and more preferably it is from 80° C. to 100° C.

<<Tension>>

After applying a coating solution of an organic light emitting layer, tension is applied to the substrate. In order to shake the structure of the organic light emitting layer to promote removal of the solvent, and in order to improve the film density, it is preferable that the tension is not given during the constant rate drying step, and that the tension is given during the decreasing rate drying step.

It is possible to apply the above-mentioned tension in a manner that a stress of less than an yield stress of the substrate is given to the substrate. When the tension in the range of giving plastic deformation is applied, the substrate may be stretched and the organic light emitting layer may be broken.

The above-mentioned tension is preferably applied in two axis directions. "To apply a tension in two axis directions" indicates to stretch 4 sides to apply a tension when the substrate is square or rectangle.

Therefore, the magnitude and the time of the tension which can be applied is determined depends on the above-mentioned heating temperature and the material of the substrate.

The substrate to which the tension is applied is preferably flexible. Although the applied tension is not limited as long as the substrate and the coated film surface are not broken, it is preferably in the range of 0.01 N/m to 50 N/m, and more preferably, it is in the range of 1 N/m to 30 N/m.

Further, the stress loaded on the substrate when the tension is applied is preferably in the range of 0.3 kPa to 150 kPa with respect to the substrate before coating the light emitting layer at a temperature of applying a tension.

(Measuring Method of Yield Stress)

The yield stress is measured with a tensile testing machine equipped with a heat retaining apparatus to the sample portion.

Tensile testing machine: TENSILON Universal Testing Machine RTG-1250 (A & D Co., Ltd.)

Stretching rate: 10 mm/minute

When the tension is 50 N/m or less, a pinhole is hardly produced and short circuit caused by a pinhole is hardy produced. The production yield becomes high. In addition, when the tension is 0.01 N/m or more, the film density will be improved, the external extraction quantum efficiency will be improved and the driving voltage will be decreased. When the tension is 1 N/m or more, the film density will be further improved, and the external extraction quantum efficiency will be further improved and the driving voltage will be further decreased. The improvement in the external extraction quantum efficiency and the decrease of the driving voltage are assumed to be resulted by the orientation of the organic light emitting layer with heating with allying tension and by the improved film density.

It is thought that more improvement in the film density can be achieved compared with the case of applying a tension in one axis direction by applying a tension in two axis directions.

In the drying process, when the tension is applied to the substrate in a web conveying direction, there is a method in which the peripheral velocity of the conveying roller of downstream is larger than that of the conveying roller of upstream. Further, when the tension is applied to the lateral direction, it is preferable to apply a tension by holding the both sides of the substrate with a right and a left holding means of the tenter.

<<Film Density>>

Generally, a film density of an organic light emitting layer produced with a wet process is smaller than a film density of an organic light emitting layer produced with a vapor deposition method.

A difference of the film density of an organic light emitting layer produced with a wet process from the a film density of an organic light emitting layer produced with a vapor deposition method using the same composing material is preferably $-0.2$ to $0.15$ g/m$^3$, and more preferably it is $0.2$ to $0.06$ g/m$^3$.

Here, the film density relating to the present invention can be determined with an X ray reflectivity measuring method. The reflectivity at a very small angle, for example, 0.2 to 2 degrees is measured. And the obtained reflectivity curve is fitted to the reflectivity scheme of a multi-layered sample obtained from Fresnel equations. The method of fitting can be referred to L. G. Parratt, Phis. Rev., 95, 259 (1954).

<<Layer Composition of Organic EL Element>>

Next, preferred layer compositions of an organic EL element of the present invention will be described below, however, the present invention is not limited to these.

(i) Anode/organic light emitting layer/electron transport layer/cathode (ii) Anode/hole transport layer/organic light emitting layer/electron transport layer/cathode (iii) Anode/hole transport layer/organic light emitting layer/hole blocking layer/electron transport layer/cathode (iv) Anode/hole transport layer/organic light emitting layer/hole blocking layer/electron transport layer/cathode buffer layer/cathode (v) Anode/anode buffer layer/hole transport layer/organic light emitting layer/hole blocking layer/electron transport layer/cathode buffer layer/cathode Among them, each layer except an anode and a cathode is also called as an organic laminated body used as a general term.

Each layer will be described in the following.

<<Organic Light Emitting Layer>>

The organic light emitting layer of the present invention is a layer, which emits light via recombination of electrons and holes injected from an electrode or a layer such as an electron transport layer or a hole transport layer. The light emission portion may be present either inside of the organic light emitting layer or at the interface between the organic light emitting layer and an adjacent layer thereof. Since deactivation of excitons may occur between the layers, it is preferable that the light emission portion is present inside of the organic light emitting layer.

Although the layer thickness of the organic light emitting layer is not limited in particular, it is preferable to adjust to be in the range of 2 to 200 nm, and more preferably in the range of 5 to 100 nm from the viewpoint of achieving a uniform layer, preventing to apply unnecessary high voltage at the time of light emission and improving the stability of emission color with respect to the driving electric current.

A host compound (it is also called as a light emitting host) and a light emitting dopant will be described in the following.

<<Host Compound>>

A host compound used in the present invention will be described.

A host compound refers to a compound contained in an organic light emitting layer in an amount of 20 weight % or more and exhibiting a phosphorescence quantum yield of less than 0.1 during phosphorescence emission at room temperature (25° C.). More preferably, the phosphorescence quantum yield of the host compound is less than 0.01.

A single compound or a plurality of host compounds may be used together as host compounds. It is possible to control the transfer of charges by making use of a plurality of host compounds, which results in high efficiency of an organic EL element. In addition, it is possible to mix a different emission lights by making use of a plurality of light emitting dopants to obtain a required emission color.

In the present invention, although there is no limitation in particular to a host compound, it is preferable to use a compound represented by Formula (a).

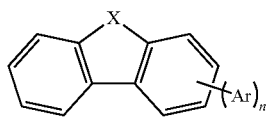

Formula (a)

(In Formula, X represents: NR', O, S, CR'CR", or SiR'R". R' and R" each represent a hydrogen atom or a substituent. Ar represents a group of atoms necessary to form an aromatic ring. "n" represents an integer of 0 to 8.)

In X of Formula (a), examples of a substituent represented by each of R' and R" include: an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group, and a pentadecyl group); a cycloalkyl group (for example, a cyclopentyl group, and a cyclohexyl group); an alkenyl group (for example, a vinyl group and an allyl group); an alkynyl group (for example, an ethynyl group and a propargyl group); an aromatic hydrocarbon ring group (also called an aromatic carbon ring or an aryl group, for example, a phenyl group, a p-chlorophenyl group, a mesityl group, a tolyl group, a xylyl group, a naphthyl group, an anthryl group, an azulenyl group, an acenaphthenyl group, a fluorenyl group, a phenantolyl group, an indenyl group, a pyrenyl group, and a biphenyryl group); an aromatic heterocyclic group (for example, a pyridyl group, a pyrimidinyl group, a furyl group, a pyrrolyl group, an imidazolyl group, a benzoimidazolyl group, a pyrazolyl group, a pyradinyl group, a triazolyl group (for example, 1,2,4-triazole-1-yl group and 1,2,3-triazole-1-yl group), an oxazolyl group, a benzoxazolyl group, a thiazolyl group, an isooxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolinyl group, a diazacarbazolyl group (indicating a ring structure in which one of the carbon atoms constituting the carboline ring in the aforesaid carbolinyl group is replaced with a nitrogen atom), a quinoxalinyl group, a pyridazinyl group, a triazinyl group, a quinazolinyl group, and a phthalazinyl group), a quinoxalinyl group, a pyridazinyl group, a triazinyl group, a quinazolinyl group, a phthalazinyl group); a heterocyclic group (for example, a pyrrolidyl group, an imidazolidyl group, a morpholyl group, and an oxazolidyl group); an alkoxyl group (for example, a methoxy group, an ethoxy group, a propyloxy group, a pentyloxy group, an hexyloxy group, an octyloxy group, and a dodecyloxy group); a cycloalkoxy group (for example, a cyclopentyloxy group and a cyclohexyloxy group); an aryloxy group (for example, a phenoxy group and a naphthyloxy group); an alkylthio group (for example, a methylthio group, an ethylthio group, a propylthio group, a pentylthio group, a hexylthio group, an octylthio group, and a dodecylthio group); a cycloalkylthio group (for example, a cyclopentylthio group and a cyclohexylthio group); an arylthio group (for example, a phenylthio group and a naphthylthio group); an alkoxycarbonyl group (for example, a methyloxycarbonyl group, an ethyloxycarbonyl group, a butyloxycarbonyl group, an octyloxycarbonyl group, and a dodecyloxycarbonyl group); an aryloxycarbonyl group (for example, a phenyloxycarbonyl group and a naphthyloxycarbonyl group); a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, and a 2-pyridylaminosulfonyl group); an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, and a pyridylcarbonyl group); an acyloxy group (for example, an acetyloxy group, an ethylcarbonyloxy group, a butylcarbonyloxy group, an octylcarbonyloxy group, a dodecylcarbonyloxy group, and a phenylcarbonyloxy group); an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, and a naphthylcarbonylamino group); a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, and a 2-pyridylaminocarbonyl group); a ureido group (for example, a methylureido group, an ethylureido group, a pentylureido group, a cyclohexylureido group, an octylureido group, a dodecylureido group, a phenylureido group, a naphthylureido group, and a 2-oyridylaminoureido group); a sulfinyl group (for example, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group, and a 2-pyridylsulfinyl group); an alkylsulfonyl group (for example, a methylsulfonyl group, an ethylsulfonyl group, a butylsulfinyl group, a cyclohexylsulfonyl group, a 2-ethylhexylsulfonyl group, and a dodecylsulfonyl group, an arylsulfonyl group or a heteroarylsulfonyl group (for example, a phenylsulfonyl group, a naphthylsulfonyl group, and a 2-pyridylsulfonyl group); an amino group (for example, an amino group, an ethylamino group, a dimethylamino group, a butylamino group, a cyclopentylamino group, a dodecylamino group, an anilino group, a naphthylamino group, and a 2-pyridylamino group); a cyano group; a nitro group; a hydroxyl group; a mercapto group; and a silyl group (for example, a trimethylsilyl group, a triisopropylsilyl group, a triphenylsilyl group, and a phenyldiethylsilyl group). These substituents may be further substituted by the above-mentioned substituent. Further, a plurality of these substituents may combine with each other to form a ring.

Among them. X is preferably to be NR' or O, and especially preferable R' are: an aromatic hydrocarbon ring group (also called an aromatic carbon ring or an aryl group, for example, a phenyl group, a p-chlorophenyl group, a mesityl group, a tolyl group, a xylyl group, a naphthyl group, an anthryl group, an azulenyl group, an acenaphthenyl group, a fluorenyl group, a phenantolyl group, an indenyl group, a pyrenyl group, and a biphenyryl; and an aromatic heterocyclic group (for example, a furyl group, a thienyl group, a pyridyl group, a pyridazinyl group, a pyrimidinyl group, a pyradinyl group, a triazinyl group, an imidazolyl group, a pyrazolyl group, a thiazolyl group, a quinazolinyl group, and a phthalazinyl group).

These aromatic hydrocarbon rings and aromatic heterocycles each may have a substituent represented by R' and R" of X in Formula (a).

In Formula (a), examples of an aromatic ring represented by Ar include an aromatic hydrocarbon ring and an aromatic heterocycle. These aromatic rings may be a single ring or a condensed ring, and further, they may be unsubstituted or substituted by R' and R" of X in Formula (a).

In Formula (a), examples of an aromatic hydrocarbon ring represented by Ar include: a benzene ring, a biphenyl ring, a naphthalene ring, an azulene ring, an anthracene ring, a phenanthrene ring, a pyrene ring, a chrysene ring, a naphthacene ring, a triphenylene ring, o-terphenyl ring, m-terphenyl ring, a p-terphenyl ring, an acenaphthene ring, a coronene ring, a fluorene ring, a fluoanthrene ring, a naphthacene ring, a pentacene ring, a perylene ring, a pentaphene ring, a picene ring, a pyrene ring, a pyranthrene ring, and an anthraanthrene ring. Further, these rings may have a substituent represented by R' and R" of X in a partial structure represented by Formula (a).

In Formula (a), examples of an aromatic heterocycle represented by Ar include: a furan ring, a dibenzofuran ring, a thiophene ring, an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a thiazole ring, an indole ring, an indazole ring, a benzimidazole ring, a benzothiazole ring, a benzoxazole ring, a quinoxaline ring, a quinazoline ring, a cinnoline ring, a quinoline ring, an isoquinoline ring, a phthalazine ring, a naphthyridine ring, a carbazole ring, a carboline ring, a diazacarbazole ring (indicating a ring structure in which one of the carbon atoms constituting the carboline ring in the aforesaid carbolinyl group is replaced with a nitrogen atom).

These rings may further have a substituent represented by R' and R" of X in Formula (a).

Among the above-described aromatic rings represented by Ar in Formula (a), preferable rings are a carbazole ring, a carboline ring, a dibenzofuran ring and a benzene ring. More preferable rings are a carbazole ring, a carboline ring and a benzene ring. Still more preferable ring is a benzene ring having a substituent Especially preferable ring is a benzene ring having a carbazolyl group.

In Formula (a), one of the preferable embodiments of an aromatic ring represented by Ar is a condensed ring having 3 or more rings. Specific examples of a condensed aromatic hydrocarbon ring having 3 or more rings are: a naphthacene ring, an anthracene ring, a tetracene ring, a pentacene ring, a hexacene ring, a phenanthrene ring, a pyrene ring, a benzopyrene ring, a benzoazulene ring, a chrysene ring, a benzochrysene ring, an acenaphthene ring, an acenaphthylene ring, a triphenylene ring, a coronene ring, a benzocoronene ring, a hexabenzocorone ring, a fluorene ring, a benzofluorene ring, a fluoranthene ring, a perylene ring, a naphthoperylene ring, a pentabenzoperylene ring, a benzoperylene ring, a pentaphene ring, a picene ring, a pyranthrene ring, a coronene ring, a naphthocoronene ring, an ovalene ring, and an anthraanthrene ring. These rings may further have a substituent as described above.

Specific examples of a condensed aromatic heterocycle having 3 or more rings are: an acridine ring, a benzoquinoline ring, a carbazole ring, a carboline ring, a phenazine ring, a phenanthridine ring, a phenanthroline ring, a carboline ring, a cycladine ring, a quindoline ring, a thebenidine ring, a quinindoline ring, a triphenodithiazine ring, a triphenodioxazine ring, a phenanthrazine ring, an anthrazine ring, a perimidine ring, a diazacarbazole ring (indicating a group in which one of the carbon atoms constituting the carboline ring is replaced with a nitrogen atom), a phenanthroline ring, a dibenzofuran ring, a dibenzothiophene ring, a naphthofuran ring, a naphthothiophene ring, a benzodifuran ring, a benzodithiophene ring, a naphthodifuran ring, a naphthodithiophene ring, an anthrafuran ring, an anthradifuran ring, an anthrathiophene ring, an anthradithiophene ring, a thianthrene ring, a phenoxathiine ring, and a thiophanthrene ring (naphthothiophene ring). These rings may further have a substituent.

In Formula (I), "n" represents an integer of 0 to 8. Preferably, it is an integer of 0 to 2, and especially preferably, it is an integer of 1 or 2.

Specific examples of a host compound represented by Formula (a) are shown below, however, the present invention is not limited to them.

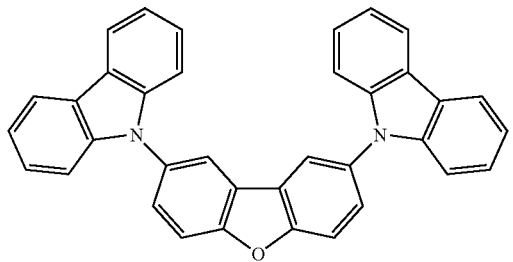
a-1
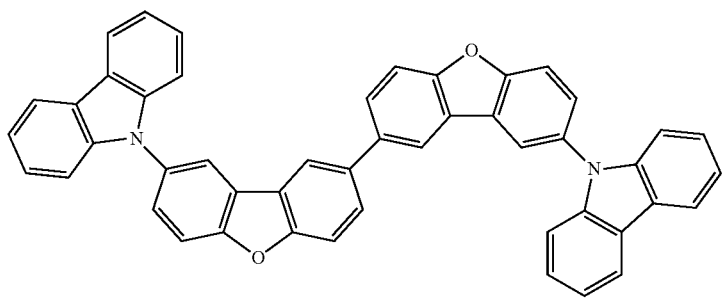
a-2
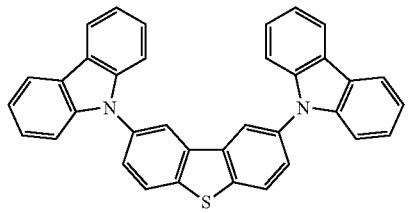
a-3
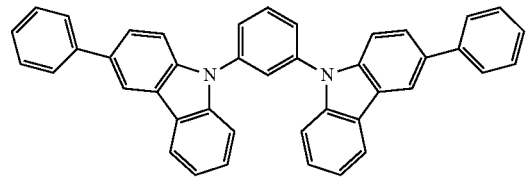
a-4
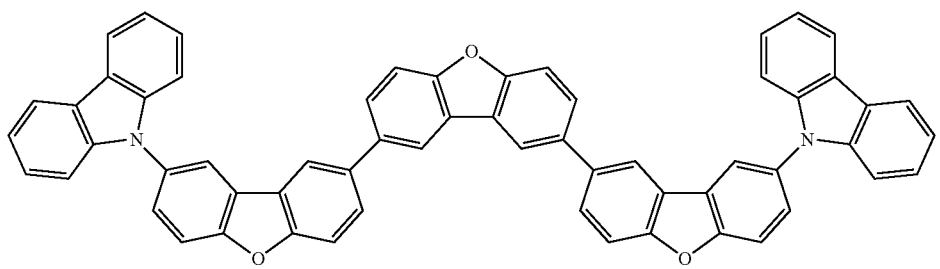
a-5
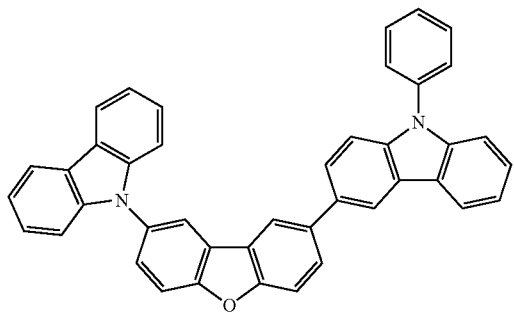
a-6

-continued
a-7
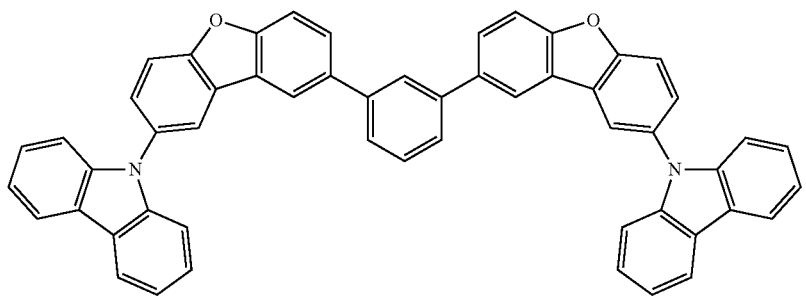
a-8
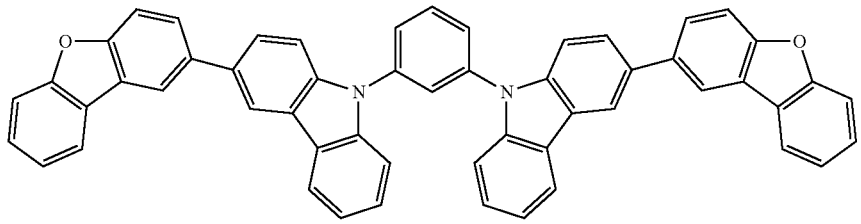
a-9
a-10
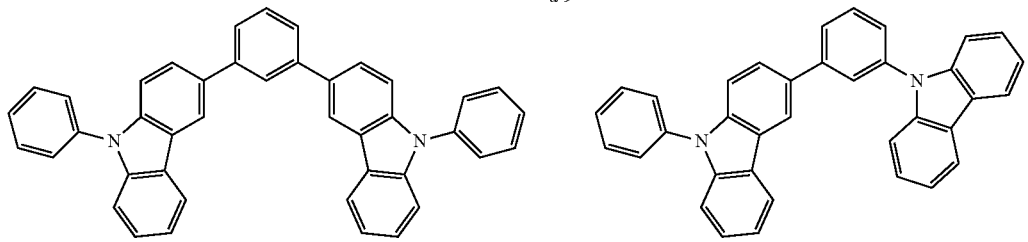
a-11
a-12
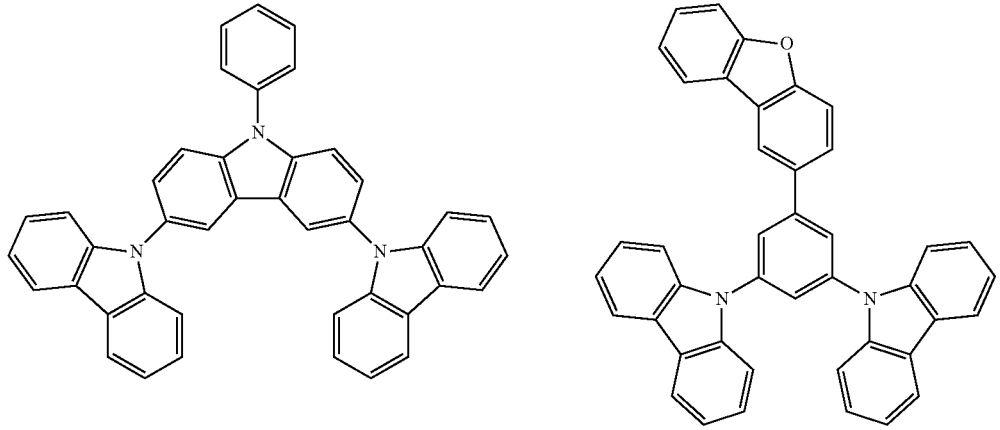
a-13
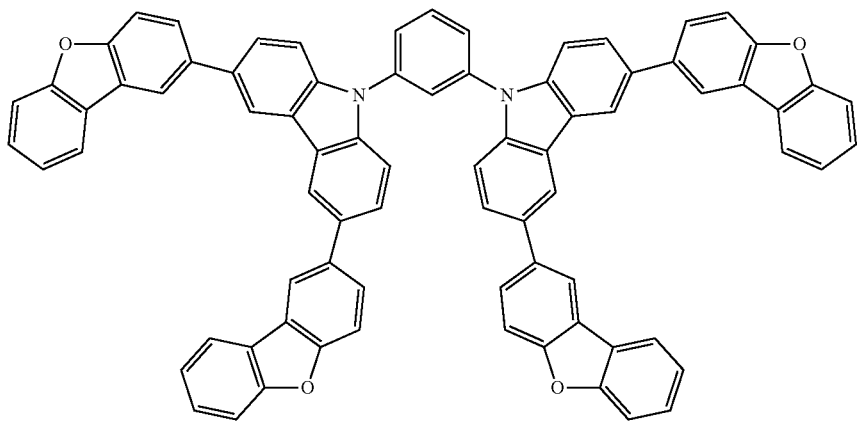

-continued
a-14
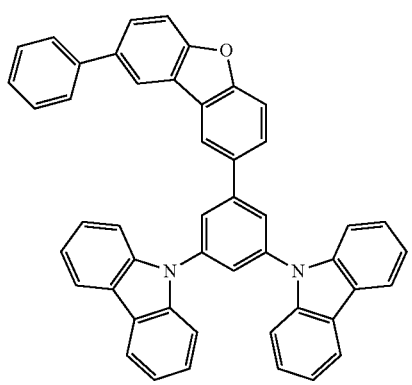
a-15
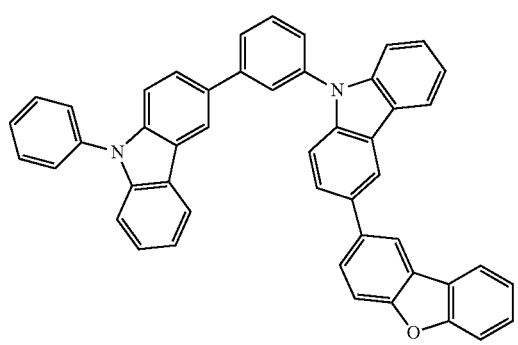
a-16
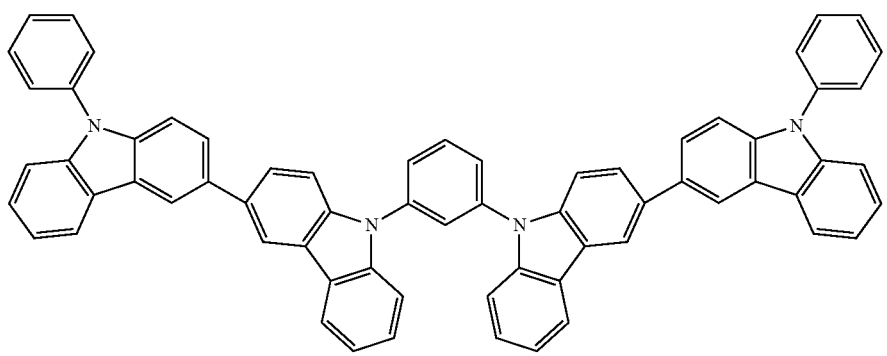
a-17
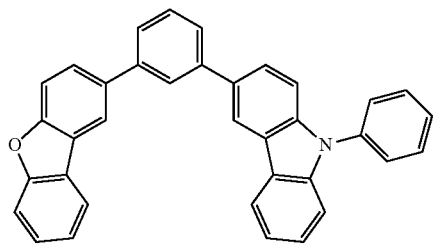
a-18
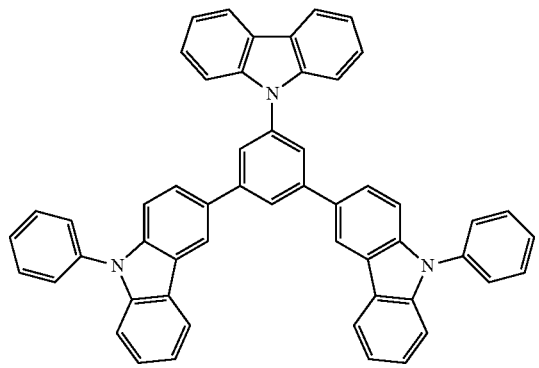
a-19
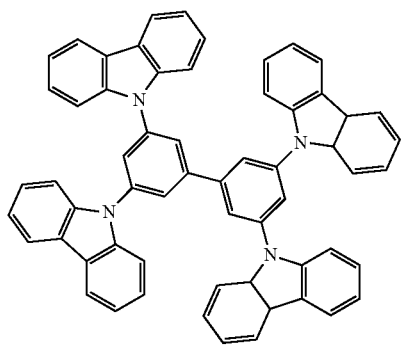
a-20
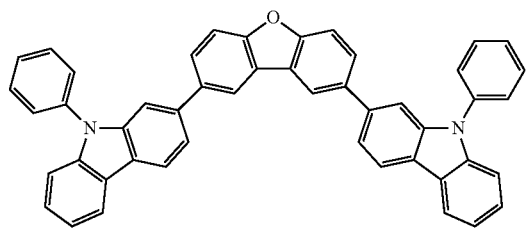

a-21
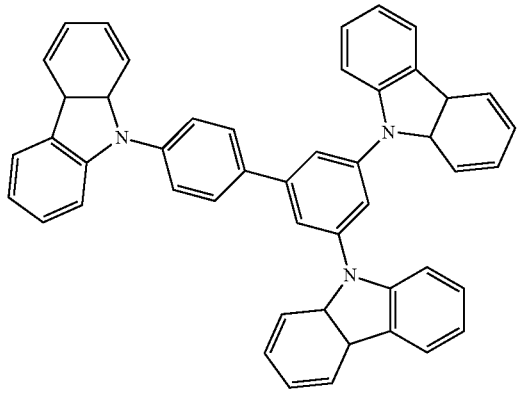
a-22
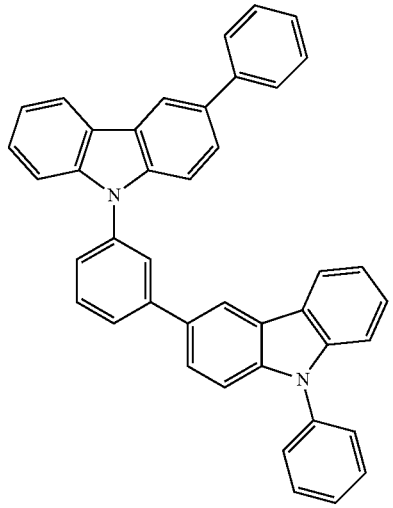
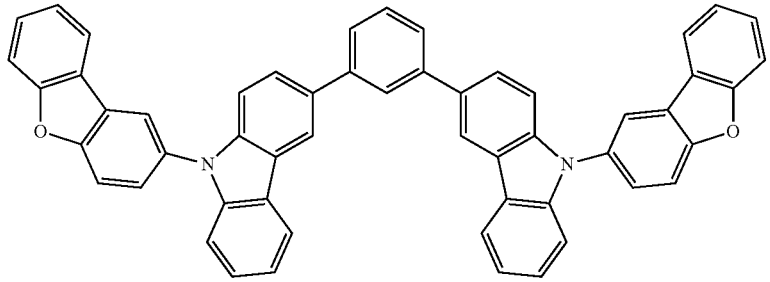
a-23
a-24
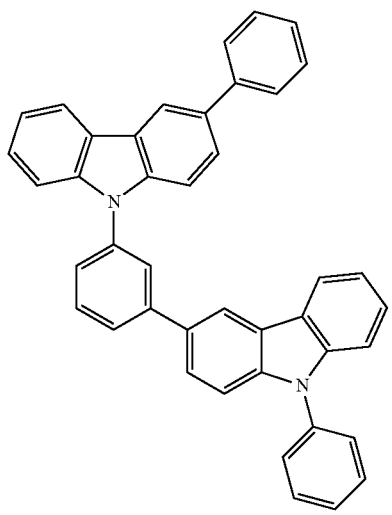
a-25
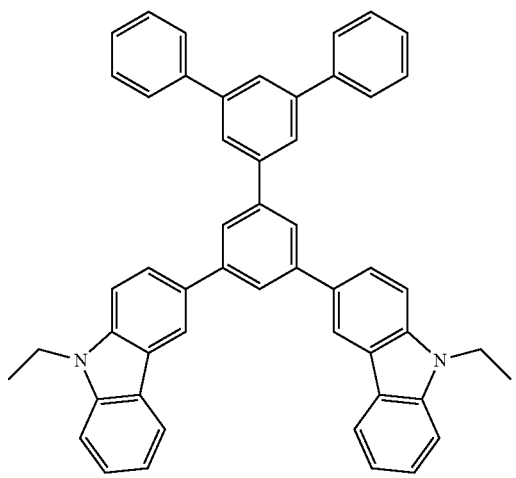

a-26
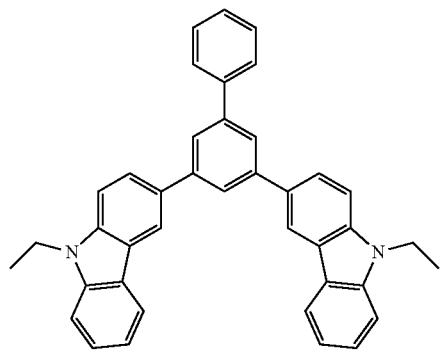
a-27
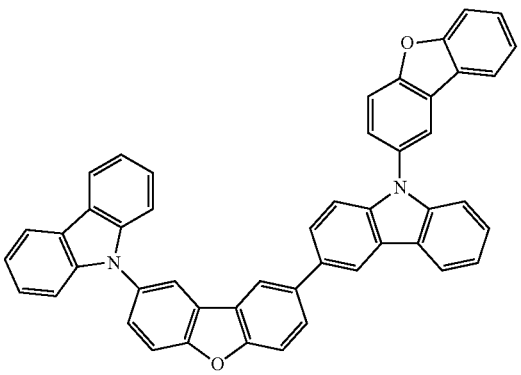
a-28
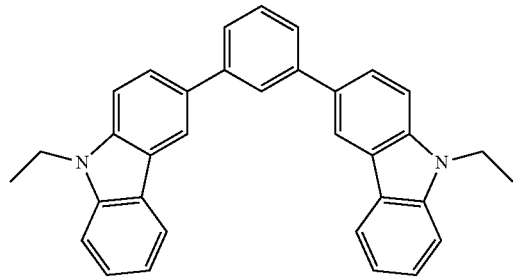
a-29
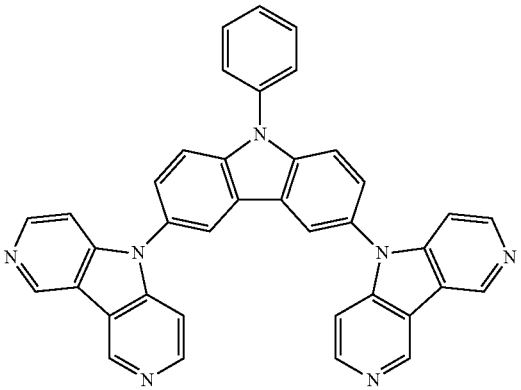
a-30
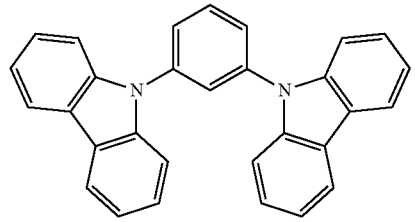
a-31
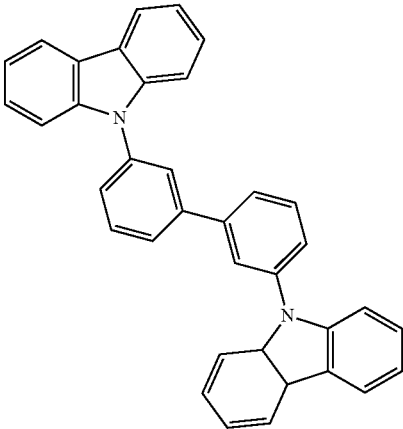

a-32
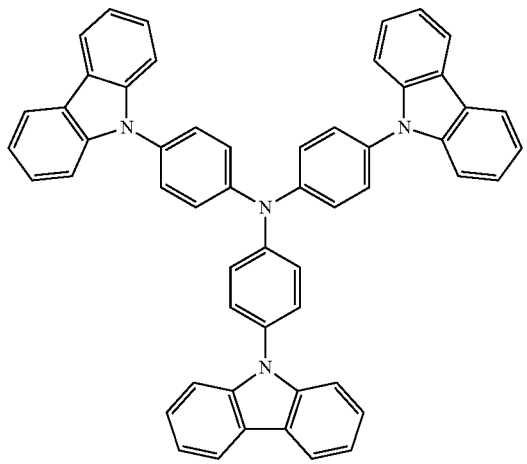
a-33
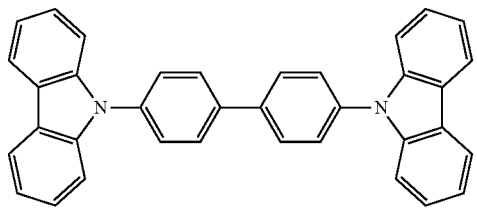
a-34
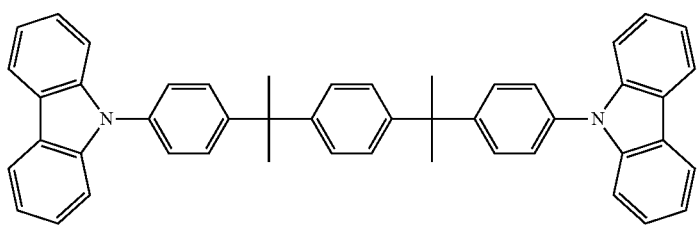
a-35
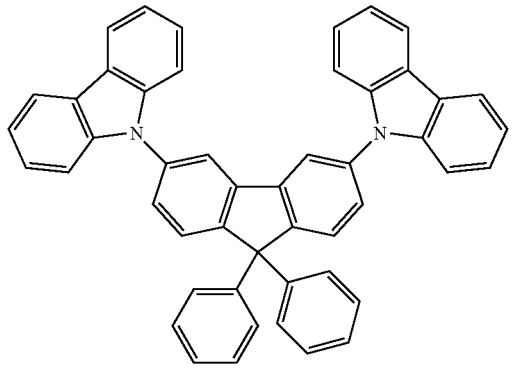
a-36
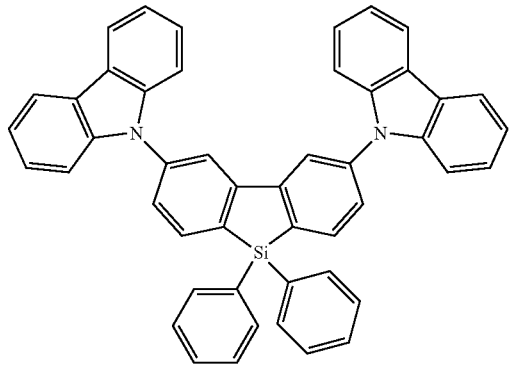
a-37
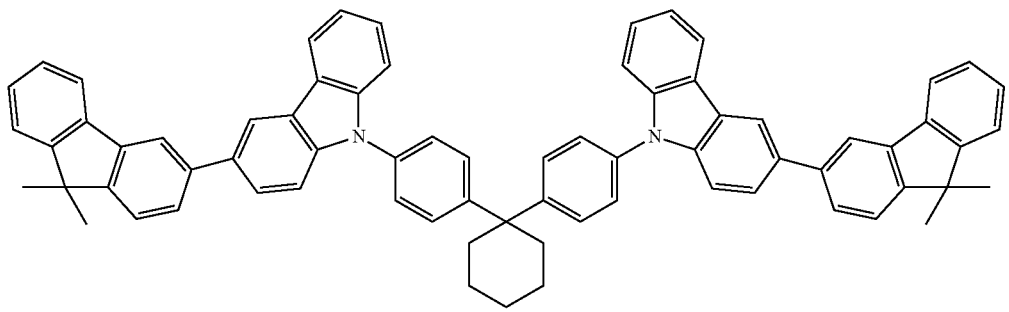
a-38
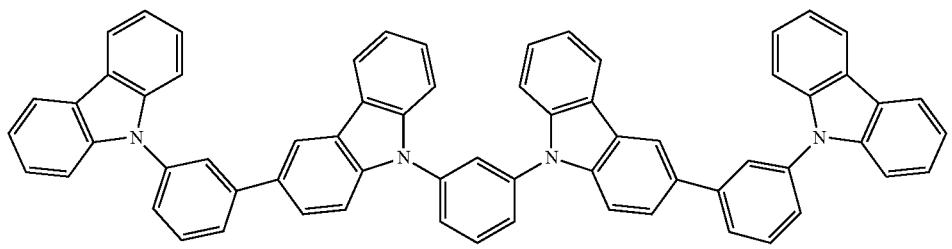

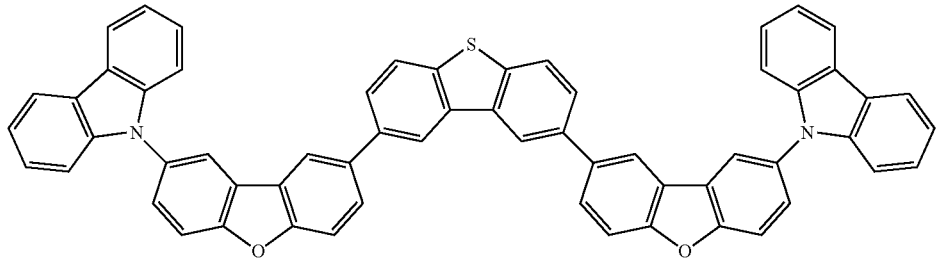

a-39

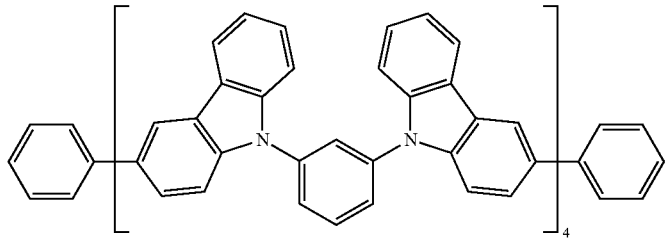

a-40

As a light emitting host used for the present invention, it may be a conventionally well-known low molecular compound and a polymer compound having a repetition unit. It may be a low molecular compound (a polymerizable light emitting host) which has a polymerizable group such as a vinyl group or an epoxy group. When a polymer compound is used, the compound may incorporate a solvent to result in easily producing a phenomenon such as swelling or gelling from which the solvent is hardly eliminated. In order to prevent this, the molecular weight of the compound is preferably not too high. Specifically, it is preferable to use material having the molecular weight of 1,500 or less at the moment of coating, and it is still more preferable to use material having the molecular weight of 1,000 or less.

Conventionally known host compound which maybe used in combination are preferably compounds having a hole transport ability and an electron transport ability, as well as preventing elongation of an emission wavelength and having a high Tg (a glass transition temperature). As specific examples of host compounds known in the fields are listed below and the compounds described in the following Documents are cited.

For example, JP-A Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

<<Light Emitting Dopant>>

The light emitting dopant of the present invention will be described.

As a light emitting dopant of the present invention, a fluorescence-emitting dopant or a phosphorescence-emitting dopant can be used. However, in order to obtain an organic EL element having a high emission efficiency, it is preferable to incorporate both a host compound described above and a phosphorescence-emitting dopant as a light emitting dopant in a light emitting layer or in a light emitting unit of an organic EL element.

As a phosphorescence-emitting dopant, there may be employed any appropriate compound selected from those known in the art used in an emission layer incorporating an organic EL element.

The phosphorescence-emitting compound of the present invention is preferably a complex compound containing, as the central metal, a metal of the 8th-10th groups of the periodic table of the elements, but is more preferably an iridium compound, an osmium compound, a platinum compound (a platinum complex compound), or a rare earth complex. Of these, an iridium compound is most preferable.

Examples of the phosphorescence-emitting compound of the present invention are listed below, but the present invention is not limited to these. The listed compounds can be synthesized via a method described, for example, in Inorg. Chem., Vol. 40, pp. 1704-1711.

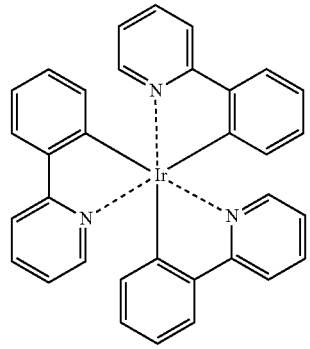

Ir-1

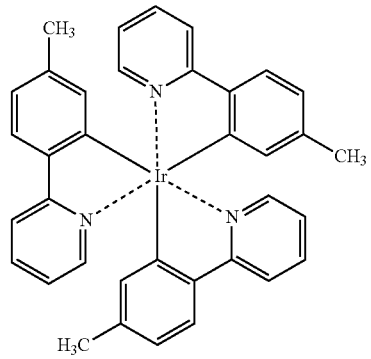

Ir-2

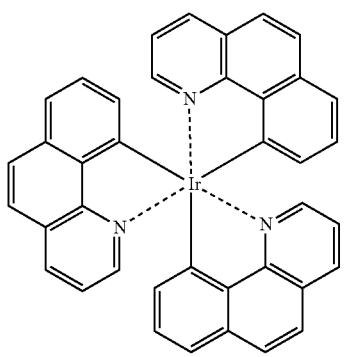
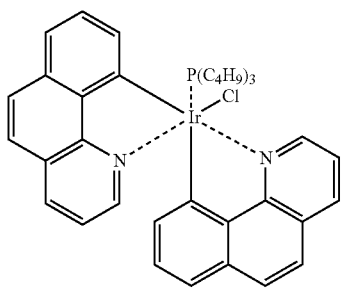
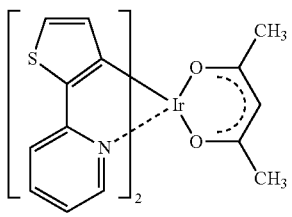
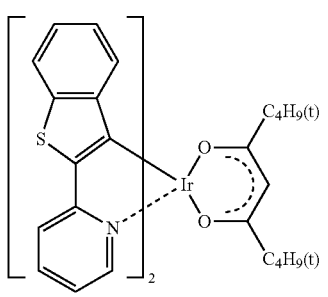
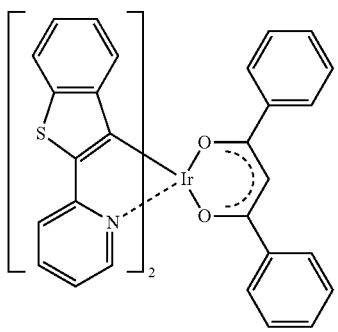
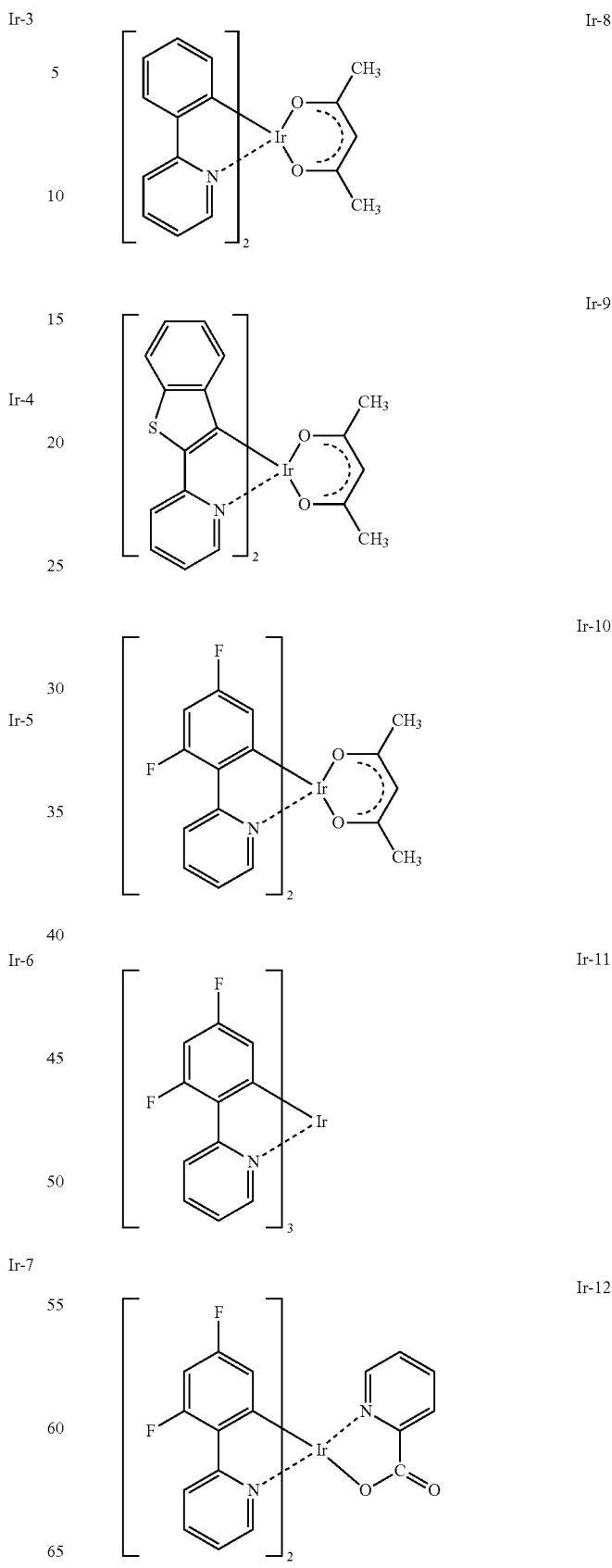

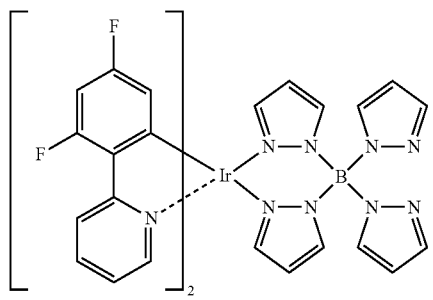
Ir-13
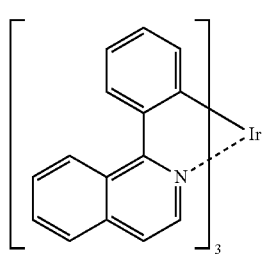
Ir-14
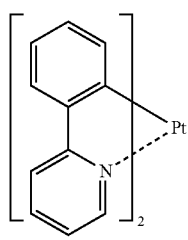
Pt-1
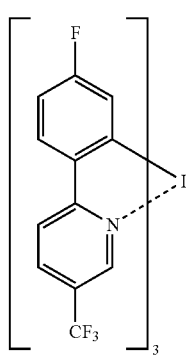
Pt-2
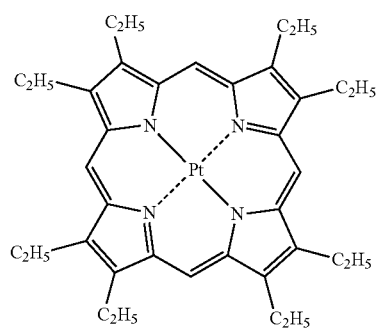
Pt-3
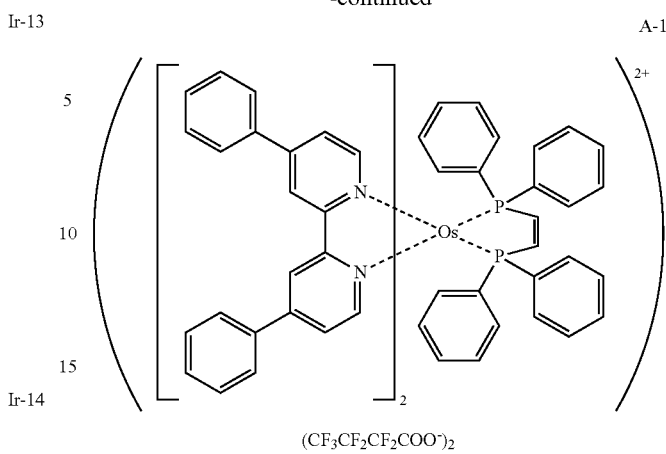
A-1
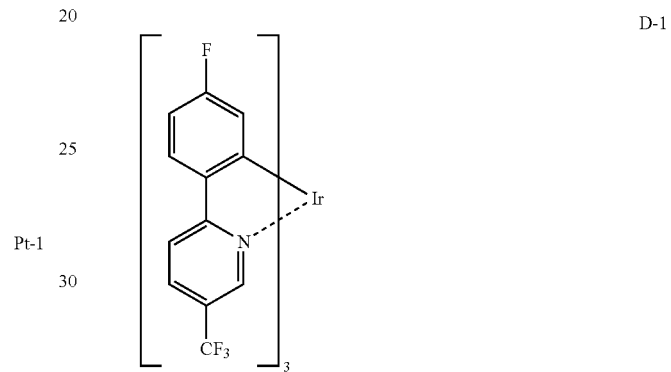
D-1
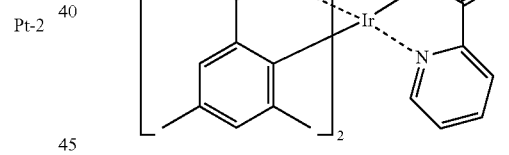
D-2
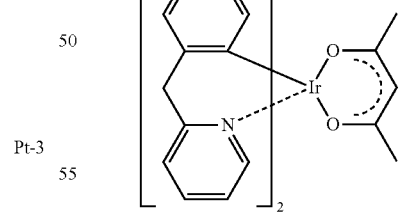
D-3
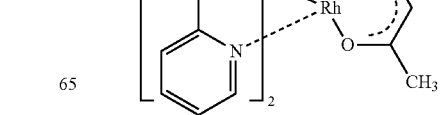
D-4

-continued

D-5 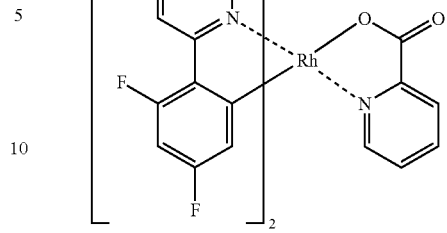

D-6 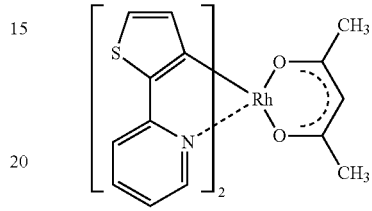

Pd-1 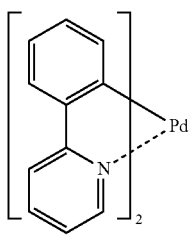

Pd-2 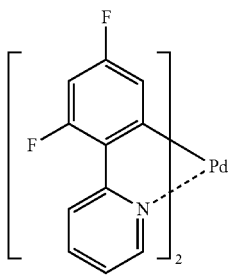

Pd-3 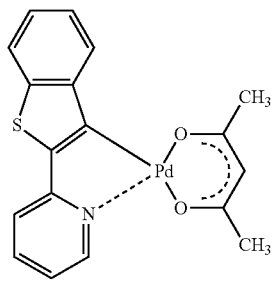

Rh-1 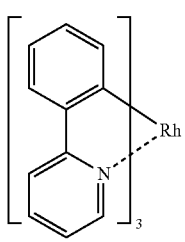

Rh-2 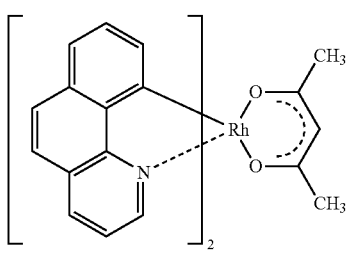

Rh-3 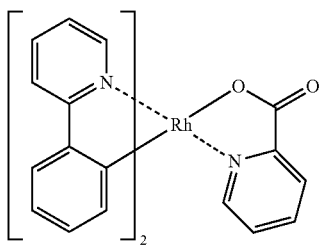

<<Injection Layer: Electron Injection Layer, Hole Injection Layer>>

An injection layer is appropriately provided and includes an electron injection layer and a hole injection layer, which may be arranged between an anode and an emission layer or a positive transfer layer, and between a cathode and an emission layer or an electron transfer layer, as described above.

An injection layer is a layer which is arranged between an electrode and an organic layer to decrease an operating voltage and to improve an emission luminance, which is detailed in volume 2, chapter 2 (pp. 123-166) of "Organic EL Elements and Industrialization Front thereof (Nov. 30, 1998, published by N. T. S Corp.)", and includes a hole injection layer (an anode buffer layer) and an electron injection layer (a cathode buffer layer).

An anode buffer layer (a hole injection layer) is also detailed in such as JP-A 9-45479, 9-260062 and 8-288069, and specific examples include such as a phthalocyanine buffer layer comprising such as copper phthalocyanine, an oxide buffer layer comprising such as vanadium oxide, an amorphous carbon buffer layer, and a polymer buffer layer employing conductive polymer such as polythiophene.

A cathode buffer layer (an electron injection layer) is also detailed in such as JP-A 6-325871, 9-17574 and 10-74586, and specific examples include a metal buffer layer comprising such as strontium and aluminum, an alkali metal compound buffer layer comprising such as lithium fluoride, an alkali earth metal compound buffer layer comprising such as magnesium fluoride, and an oxide buffer layer comprising such as aluminum oxide. The above-described buffer layer (injection layer) is preferably a very thin layer, and the layer thickness is preferably in a range of 0.1 nm to 5 μm although it depends on a raw material.

<<Blocking Layer: Hole Blocking Layer, Electron Blocking Layer>>

A blocking layer is provided if needed in addition to the basic constitution layer structures in the organic thin layers of the present invention. Examples of such a blocking layer are hole blocking layers (hole block layers) described in JP-A Nos. 11-204258 and 11-204359 and p. 273 of "Organic EL Elements and Industrialization Front Thereof (Nov. 30 (1998), published by N. T. S Corp.)".

A hole blocking layer, in a broad meaning, is provided with a function of electron transport layer, being comprised of a material having a function of transporting an electron but a very small ability of transporting a hole, and can improve the recombination probability of an electron and a hole by blocking a hole while transporting an electron. Further, a constitution of an electron transport layer described later can be appropriately utilized as a hole blocking layer of an organic EL element according to this invention.

The hole blocking layer in the organic EL element of the present invention is preferably provided adjacent to the organic light emitting layer.

The hole blocking layer preferably incorporates an azacarbazole derivative for a host compound as described above.

In the present invention, when the organic EL element has a plurality of emission layers each emitting a different emission color, it is preferable that an emission layer emitting a light of a shortest wavelength is provided at the nearest position to the anode among all of the emission layers. In such case, it is preferable that a hole blocking layer is further provided between the aforementioned emission layer of the shortest wavelength and the emission layer secondary nearest to the anode. Further, it is preferable that 50 weight % or more of a compound contained in the hole blocking layer exhibits a ionization potential of at least 0.3 eV larger than that of a host compound in the aforementioned emission layer of the shortest wavelength.

An ionization potential is defined as a required energy to emit an electron stayed on a HOMO (highest occupied molecular orbital) of a compound to a vacuum level. The ionization potential can be obtained using the following methods, for example.

(1) Gaussian 98 (Gaussian 98, Revision A. 11. 4, M. J. Frisch, et al, Gaussian, Inc., Pittsburgh Pa., 2002), which is software for a molecular orbital calculation, and produced by Gaussian Inc. The ionization potential value of the compound of the present invention can be calculated via structure optimization employing B3LYP/6-31G* as a key word and converted in eV unit after rounded off to one decimal place. The reason for the calculated value being considered to be valid is that the calculated value obtained by the above method is in good agreement with the experimental one.

(2) An ionization potential can be directly obtained by measuring with a photoelectron spectroscopy. Such measurement can be appropriately done using, for example, a low energy photoelectron spectroscopy "Model Ac-1" made by Riken Keiki Co., Ltd or a ultra-violet photoelectron spectroscopy.

Meanwhile, an electron blocking layer has a function of a hole transport layer in a broad sense. An electron blocking layer is composed a material having a property to transport a hole and, at the same time, having a very weak property to transport an electron. It is possible to improve the recombination rate of an electron and a hole by transporting a hole and blocking an electron from transporting. A structure of a hole transport layer can be used for an electron blocking layer. The layer thickness of the hole blocking layer and the electron transport layer according to the present invention is preferably from 3 nm to 100 nm, and is more preferably from 5 nm to 30 nm.

<<Hole Transport Layer>>

A hole transport layer contains a material having a function of transporting a hole, and in a broad meaning, a hole injection layer and an electron blocking layer are also included in a hole transport layer. A single layer of or plural layers of a hole transport layer may be provided.

A hole transport material is those having any one of a property to inject or transport a hole or a barrier property to an electron, and may be either an organic substance or an inorganic substance. For example, listed are a triazole derivative, an oxadiazole derivative, an imidazole derivative, a polyallylalkane derivative, a pyrazolone derivative, a phenylenediamine derivative, a allylamine derivative, an amino substituted chalcone derivative, an oxazole derivatives, a styrylanthracene derivative, a fluorenone derivative, a hydrazone derivative, a stilbene derivative, a silazane derivative, an aniline type copolymer, or conductive polymer oligomer and specifically preferably such as thiophene oligomer.

As a hole transport material, those described above can be utilized, however, it is preferable to utilized a porphyrin compound, an aromatic tertiary amine compound and a styrylamine compound, and specifically preferably an aromatic tertiary amine compound.

Typical examples of an aromatic tertiary amine compound and a styrylamine compound include N,N,N',N'-tetraphenyl-4,4'-diaminophenyl; N,N'-diphenyl-N,N'-bis(3-methylphenyl)-(1,1'-biphenyl)-4,4'-diamine (TDP); 2,2-bis(4-di-p-tolylaminophenyl)propane; 1,1-bis(4-di-p-tolylaminophenyl)cyclohexane; N,N,N',N'-tetra-p-tolyl 4,4'-diaminobiphenyl; 1,1-bis(4-di-p-tolylaminophenyl)-4-phenylcyclohexane; bis(4-dimethylamino-2-methyl)phenylmethane; bis(4-di-p-tolylaminophenyl)phenylmethane; N,N'-diphenyl-N,N'-di(4-methoxyphenyl)-4,4'-diaminobiphenyl; N,N,N',N'-tetraphenyl-4,4'-diaminophenylether; 4,4'-bis(diphenylamino)quarterphenyl; N,N,N-tri(p-tolyl)amine; 4-(di-p-tolylamino)-4'-[4-(di-p-triamino)styryl]stilbene; 4-N,N-diphenylamino-(2-diphenylvinyl)benzene; 3-methoxy-4'-N,N-diphenylaminostilbene; and N-phenylcarbazole, in addition to those having two condensed aromatic rings in a molecule described in U.S. Pat. No. 5,061,569, such as 4,4'-bis[N-(1-naphthyl)-N-phenylamino]biphenyl (NDP), and 4,4',4"-tris[N-(3-methylphenyl)-N-phenylamino]triphenylamine (MDTDATA), in which three of triphenylamine units are bonded in a star burst form, described in JP-A 4-308688.

Polymer materials, in which these materials are introduced in a polymer chain or constitute the main chain of polymer, can be also utilized. Further, an inorganic compound such as a p type-Si and a p type-SiC can be utilized as a hole injection material and a hole transport material.

It can be used a so-called p type hole transport material described in JP-A 11-251067 and J. Huang et al., Applied Physics Letters 80 (2002), p. 139. It is preferable to use these compounds in the present invention because they enable to give an emission element with a high emitting efficiency.

This hole transport layer can be prepared by forming a thin layer made of the above-described hole transport material according to a method well known in the art such as a vacuum evaporation method, a spin coating method, a cast method, an inkjet method and a LB method. The layer thickness of a hole transport layer is not specifically limited, however, is generally 5 nm to 5 μm, and preferably 5 nm to 200 nm. This hole transport layer may have a single layer structure composed of one or at least two types of the above described materials.

Further, an impurity-doped hole transport layer exhibiting high p-characteristics may be used. Examples thereof include those described in JP-A Nos. 4-297076, 2000-196140, and 2001-102175, as well as J. Appl. Phys., 95, 5773 (2004).

In the present invention, such a hole transport layer exhibiting high p-characteristics is preferably used to produce a low power consuming element.

<<Electron Transport Layer>>

An electron transfer layer is comprised of a material having a function to transfer an electron, and an electron injection layer and a hole blocking layer are included in an electron transfer layer in a broad meaning. A single layer or plural layers of an electron transfer layer maybe provided.

In the past, when a mono or plural electron transport layers are arranged in the position nearer to the cathode with respect to an organic light emitting layer, an electron transfer material (also used as a hole blocking material) in an electron transport layer is required to have a function to transport an electron injected from a cathode to an emission layer. The compounds conventionally well known in the art can be utilized by arbitrarily selection as a material thereof. Examples of a material utilized in this electron transfer layer (hereinafter, referred to as an electron transfer material) include such as a nitro-substituted fluorene derivative, a diphenylquinone derivative, a thiopyradineoxide derivative, a heterocyclic tetracarbonic acid anhydride such as naphthaleneperylene, carbodiimide, a fluorenylidenemethane derivative, anthraquinonedimethane and anthrone derivatives, and an oxadiazole derivative. Further, a thiazole derivative in which an oxygen atom in the oxadiazole ring of the above-described oxadiazole derivative is substituted by a sulfur atom, and a quinoxaline derivative having a quinoxaline ring which is known as an electron attracting group can be utilized as an electron transfer material. Polymer materials, in which these materials are introduced in a polymer chain or these materials form the main chain of polymer, can be also utilized.

Further, a metal complex of a 8-quinolinol derivative such as tris(8-quinolinol)aluminum (Alq), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum and bis(8-quinolinol)zinc (Znq); and metal complexes in which a central metal of the aforesaid metal complexes is substituted by In, Mg, Cu, Ca, Sn, Ga or Pb, can be also utilized as an electron transfer material. Further, metal-free or metal phthalocyanine, or those whose terminal is substituted by an alkyl group and a sulfonic acid group, can be preferably utilized as an electron transfer material.

Further, distyrylpyrazine derivative, which has been exemplified as a material of an emission layer, can be also utilized as an electron transfer material, and, similarly to the case of a hole injection layer and a hole transfer layer, an inorganic semiconductor such as an n-type-Si and an n-type-SiC can be also utilized as an electron transfer material.

The electron transport layer can be prepared by forming a thin layer made of the above-described electron transport material according to a method well known in the art such as a vacuum evaporation method, a spin coating method, a cast method, a printing method such as an inkjet method, and a LB method. The layer thickness of an electron transport layer is not specifically limited; however, is generally 5 nm to 5 µm, and preferably 5 nm to 200 nm. This electron transport layer may have a single layer structure comprised of one or at least two types of the above described materials.

An electron transport layer containing a doped impurity and having a high n-property can be used. Examples are shown in JP-A 04-297076, 10-270172, 2000-196140, 2001-102175, and J. Appl. Phys., 95, 5773 (2004).

In the present invention, it is preferable to use an electron transport layer having a high n-property for achieving an element to be driven with low electric power consumption.

<<Anode>>

As an anode according to an organic EL element of this invention, those comprising metal, alloy, a conductive compound, which is provided with a large work function (4 eV or more), and a mixture thereof as an electrode substance are preferably utilized. Specific examples of such an electrode substance include a conductive transparent material such as metal like Au, CuI, indium tin oxide (ITO), $SnO_2$ and ZnO. Further, a material such as IDIXO ($In_2O_3$—ZnO), which can prepare an amorphous and transparent electrode, may be also utilized.

As for an anode, these electrode substances may be made into a thin layer by a method such as evaporation or spattering and a pattern of a desired form may be formed by means of photolithography, or in the case of requirement of pattern precision is not so severe (about 100 µm or more), a pattern may be formed through a mask of a desired form at the time of evaporation or spattering of the above-described substance. In case that a material (such as organic electric conductive compounds) capable of being coated is used, a printing method or a wet type film-forming method such as a coating method can be applied. When emission is taken out of this anode, the transmittance is preferably set to be 10% or more and the sheet resistance as an anode is preferably a few hundreds $\Omega/\square$ or less. Further, although the layer thickness depends on a material, it is generally selected in a range of 10 nm to 1,000 nm and preferably selected in a range of 10 nm to 200 nm.

<<Cathode>>

On the other hand, as a cathode according to this invention, metal, alloy, a conductive compound and a mixture thereof, which have a small work function (4 eV or less), are utilized as an electrode substance. Specific examples of such an electrode substance includes such as sodium, sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture and rare earth metal.

Among them, with respect to an electron injection property and durability against such as oxidation, preferable are a mixture of electron injection metal with the second metal which is stable metal having a work function larger than electron injection metal, such as a magnesium/silver mixture, a magnesium/aluminum mixture, a magnesium/indium mixture, an aluminum/aluminum oxide ($Al_2O_3$) mixture and a lithium/aluminum mixture, and aluminum. As for a cathode, these electrode substances may be made into a thin layer by a method such as evaporation or spattering.

The sheet resistance as a cathode is preferably a few hundreds $\Omega/\square$ or less and the layer thickness is generally selected in the range of 10 nm to 5 µm and preferably in the range of 50 nm to 200 nm. Herein, to transmit emission, either one of an anode or a cathode of an organic EL element is preferably transparent or translucent to improve the mission luminance.

Further, a transparent or a translucent cathode can be made by applying a transparent conductive material on a cathode after providing the above-described metal on the cathode in a thickness of 1 nm to 20 nm which. The transparent conductive materials are described in the section for anode. By applying these materials, it can be made an element having both an anode and a cathode provided with a property of transparent.

<<Substrate>>

Examples of a substrate (hereinafter, it maybe called as a support substrate) are glass and plastics. The kinds of which are not specifically limited. They may be transparent or opaque. When an emission of light is taken from the side of the substrate, the support is preferably transparent. Specifically preferable substrates are resin films which enable to give flexibility to an organic EL element.

The following can be cited as examples of a resin film. Polyesters (e.g., polyethylene terephthalate (PET), polyethylenenaphthalate (PEN)), polyethylene, polypropylene, cellophane, cellulose esters or those derivatives (e.g., cellulose di acetate, cellulose triacetate, cellulose acetate butyrate, cellulose acetate propionate (CAP), cellulose acetate phthalate (TAC), cellulose nitrate)polyvinylidene chloride, polyvinyl alcohol, polyethylene vinyl alcohol, syndiotactic polystyrene, polycarbonate, norbornene resin, polymethyl pentene, polyether ketone, polyimide, polyether sulfone (PES), polyphenylene sulfide, polysulfones, polyetherimide, polyether ketoneimide, polyamide, fluororesin, nylon, polymethylmethacrylate, acrylic resins, or polyarylates, cycloolefin resins (e.g., ARTON (trade name made by JSR), or APEL (trade name made by Mitsui Chemicals, Inc).

On the surface of the resin film, a film of inorganic or organic compounds or a hybrid film of both of them may be formed. The above film is preferably a barrier film exhibiting a water vapor permeability of 0.01 g/m$^2$/day·atm or less. Further, the above film is preferably a high barrier film exhibiting an oxygen permeability of $10^{-3}$ cm$^3$/m$^2$/day or less, and the water vapor permeability exhibiting $10^{-5}$ g/m$^2$/day or less.

Any materials may be employed to form the barrier film as long as they exhibit the function to retard penetration of substances such as moisture or oxygen, which will lead to degradation of the element, and the materials such as silicon oxide, silicon dioxide, or silicon nitride may be employed. Further, in order to reduce brittleness, it is preferable to form a laminated layer structure composed of a layer comprising the above inorganic material, and a layer comprising an organic material. The lamination order of the inorganic and organic layers is not particularly limited, but it is preferable that both layers are alternated several times.

Formation methods of the barrier film are not particularly limited, and it is possible to employ, for example, a vacuum deposition method, a sputtering method, a reactive sputtering method, a molecular beam epitaxial method, a cluster ion beam method, an ion plating method, a plasma polymerization method, an atmospheric pressure plasma polymerization method, a plasma CVD method, a laser CVD method, a thermal CVD method, and a coating method. Of these, particularly preferred is the atmospheric pressure plasma polymerization method, as described in JP-A No. 2004-68143.

Examples of opaque substrates include metal plates or films such as aluminum or stainless steel, opaque resin substrates, and substrates composed of ceramic materials.

The quantum efficiency of light extraction to the outside of the light emission of the organic EL element of the present invention at room temperature is preferably 1% or more, and more preferably 5% or more.

Herein, External extraction quantum efficiency (%)= [(Number of photons emitted out of Organic EL element)/ (Number of electrons supplied to Organic EL element)]×100.

A hue improving filter such as a color filter, or a color conversion filter, which converts emitted light color from an organic EL element to multi-color by employing a fluorescent compound, may be used in combination. In the case where the color conversion filter is used, the λmax of the light emitted from the organic EL element is preferably 480 nm or less.

<<Sealing>>

Sealing means employed in the present invention include, for example, a method which allows a sealing member to adhere to an electrode and a substrate employing adhesives.

Any sealing member may be employed as long as they are arranged to cover the display region of the organic EL element, and may be either in the form of an intaglio plate or a flat plate. Further, properties of transparency or electric insulation are not particularly required.

Specific examples include a glass plate, a polymer plate/ film, and a metal plate/film. Glass plates may include specifically soda-lime glass, barium and strontium containing glass, lead glass, aluminosilicic acid glass, borosilicic acid glass, barium borosilicic acid glass, and quartz. Polymer plates may include polycarbonate, acryl, polyethylene terephthalate, polyether sulfide, and polysulfone. Metal plates may be composed of at least one metal selected from the group consisting of stainless steel, iron, copper, aluminum, magnesium, nickel, zinc, chromium, titanium, molybdenum, silicon, germanium and tantalum, or an alloy composed of at least two metals selected from the above group.

In the present invention, polymer or metal films may be preferably employed since they can make the element thinner. Furthermore, it is preferable that the polymer film exhibits an oxygen permeability of $1 \times 10^{-3}$ ml/m$^2$/24 h or less, which is determined by the method based on JIS K 7126-1987, and a water vapor permeability of $1 \times 10^{-3}$ g/(m$^2$/24 h) or less (at 25±0.5° C. and 90±2% RH), which is determined by the method based on JIS K 7129-1992.

In order to process a sealing member to form a concave shape, sand blasting or chemical etching may be employed.

Specific examples of an adhesive include photocurable and thermocurable type adhesives having a reactive vinyl group of acrylic acid oligomers and methacrylic acid oligomers, and moisture curable type adhesives such as 2-cyanoacrylic acid ester. Thermal and chemical curing type (two blended liquids) adhesives such as an epoxy adhesive are also included. Hot-melt type polyamide, polyester, and polyolefin are also included. Further, cationically curable type ultraviolet ray curable type epoxy resin adhesives are included.

Since organic EL elements are occasionally degraded due to a thermal treatment, adhesives which are adhesion-curable at from room temperature to 80° C. are preferred. Further, desiccants may be dispersed into the above adhesives. Application of the adhesives onto the sealing portion may be achieved by employing a commercial dispenser or may be printed in the same manner as screen printing.

Further, inorganic and organic material layers are appropriately formed as a sealing film in such a way that from exterior of an electrode facing the substrate, of the two electrodes sandwiching the organic layer, the aforesaid electrode and organic layer are covered and the sealing film contacts the substrate. In this case, any appropriate materials may be applied to the aforesaid film which exhibits a function to retard penetration of substances such as moisture and oxygen, which substances will lead to degradation of the element, and materials such as silicon oxide, silicon dioxide, or silicon nitride may be employed. Further, in order to reduce brittleness, it is preferable to form a laminated layer structure composed of an inorganic layer and a layer composed of organic materials.

Preparation methods of the above films are not particularly limited, and it is possible to employ, for example, a vacuum deposition method, a sputtering method, a reactive sputtering method, a molecular beam epitaxial method, a cluster ion beam method, an ion plating method, a plasma polymerization method, an atmospheric pressure plasma polymerization method, a plasma CVD method, a laser CVD method, a thermal CVD method, and a coating method.

Into the space between the sealing member and the display area of the organic EL element, in the case where the space is to be a gas or liquid phase, inert gases such as nitrogen and argon or inert liquids such as fluorinated hydrocarbon and silicone oil are preferably injected. The space may also be a vacuum space. Further, hygroscopic compounds may be enclosed within the interior.

Examples of the hygroscopic compounds include metal oxides (for example, sodium oxide, potassium oxide, calcium oxide, barium oxide, magnesium oxide, or aluminum oxide), sulfates (for example, sodium sulfate, calcium sulfate, magnesium sulfate, or cobalt sulfate), metal halides (for example, calcium chloride, magnesium chloride, cesium fluoride, tantalum fluoride, cerium bromide, magnesium bromide, barium iodide, or magnesium iodide), and perchlorates (for example, barium perchlorate or magnesium perchlorate). In sulfates, metal halides and perchlorates, anhydrous salts are suitably employed.

<<Preparation Method of Organic EL Element>>

In a production method of an organic EL Element of the present invention, at least an organic light emitting layer is formed with a wet process among the organic laminated body sandwiched between the anode and the cathode. Preferably, at least 4 layers including an organic light emitting layer are formed with a wet process. It is particularly preferable to form all of the organic laminated body with a wet process from the viewpoint of productivity. The wet process in the present invention indicates a layer forming process in which a layer forming material is supplied in a solution form when forming a layer.

As an example of the preparation method of the organic EL element of the present invention, a preparation method of an organic EL element composed of: an anode/a hole injection layer/a hole transport layer/an organic light emitting layer/an electron transport layer/an electron injection layer/a cathode is described below.

First, a thin film composed of desired electrode materials, such as anode materials, is formed on a suitable substrate via a vacuum deposition or sputtering method so as to have a film thickness of 1 µm or less, preferably in the range of 10 to 200 nm to prepare an anode.

Subsequently, on the above anode, thin films of organic compounds composed of a hole injection layer, a hole transport layer, an organic light emitting layer, an electron transport layer, an electron injection layer, and a hole blocking layer, all of which are materials for the organic EL element, are formed.

Examples of a forming method of each of these layers are, as described above: a vapor-depositing method, a wet process (for example, a spin coat method, a die coat method, a cast method, an ink-jet method, a spray method and a printing method)

When the constituting layers of an organic EL element of the present invention are formed with a coating method, examples of liquid media for dissolving or dispersing the organic materials are as follows. Usable liquid media are: ketones such as methyl ethyl ketone, and cyclohexanone; fatty acid esters such as ethyl acetate; halogenated hydrocarbons such as dichlorobenzene; aromatic hydrocarbons such as toluene, xylene, mesitylene, and cyclohexylbenzene; aliphatic hydrocarbons such as cyclohexane, decaline, and dodecane; and organic solvents such as DMF and DMSO.

After formation of these layers, a thin film comprising a cathode material is formed thereon to have a thickness of 1 µm or less, preferably to have a thickness in a range of 50 to 200 nm by means of such as vacuum deposition or spattering to provide a cathode, whereby a desired organic EL element can be prepared.

Further, the above preparation order may be reversed, and preparation may be conducted in the order of the cathode, the electron injection layer, the electron transport layer, the light emitting layer, the hole transport layer, the hole injection layer, and the anode. In the case where direct current voltage is applied to the multicolor display device prepared as above, light emission can be observed when a voltage of 2 to 40 V is applied while the anode is set to a positive polarity and the cathode is set to a negative polarity. Further, alternating current voltage may be applied, of which any waveforms of the applied alternating current may be employed.

<<Protective Film and Protective Plate>>

To enhance mechanical strength of the element, a protective film or a protective plate may be provided on the exterior of the above sealing film which was provided on the side facing a substrate, while sandwiching the organic layer. Specifically, in the case where the sealing is conducted via the above sealing film, the resulting strength is not always sufficient. Consequently, it is preferable to provide the above protective film or protective plate. As usable materials for the above, glass plates, polymer plate/film, and metal plate/film which are the same as those employed for the above sealing may be employed. In view of allowing the element to be lighter and thinner, it is preferable to employ a film.

<<Light Extraction>>

It is commonly stated that the organic EL element emits light in a layer exhibiting a higher refractive index (being about 1.7 to 2.1) than that of air, whereby only about 15% to 20% of light emitted in the light emitting layer can be taken out. The reasons for the above are as follows: the light incoming to the interface (the interface between the transparent substrate and air) at angle □ which is greater than the critical angle is totally reflected, whereby no light is taken out to the exterior of the element; and the light is totally reflected between the transparent electrode or the light emitting layer and the transparent substrate so that the light is wave-guided through the transparent electrode or the light emitting layer, and as a result the light escapes to the side direction of the element.

Means to increase the light extraction efficiency include, for example, a method in which irregularity is formed on the surface of the transparent substrate so that total reflection at the interface between the transparent substrate and air is minimized (U.S. Pat. No. 4,774,435); a method in which efficiency is enhanced by allowing the substrate to exhibit light focusing properties (JP-A No. 63-314795); a method in which a reflective surface is formed on the side of the element (JP-A No. 1-220394); a method in which a flat layer exhibiting an intermediate refractive index is introduced between the substrate and the light emitting body, whereby an reflection inhibiting film is formed (JP-A No. 62-172691); a method in which a flat layer exhibiting a refractive index lower than that of the substrate is introduced between the above substrate and the light emitting body (JP-A No. 2001-202827); and a method in which a diffraction grating is arranged between any layers of the substrate, the transparent electrode layer and the light emitting layer (including between the substrate and the exterior) (JP-A No. 11-283751).

In the present invention, the above methods may be employed in combination with the organic EL element of the present invention. However, there may be suitably employed the method to introduce a flat layer exhibiting a lower refractive index than that of the substrate between the above substrate and the light emitting body, or the method to arrange a diffraction grating between any layers of the substrate, the transparent electrode layer and the light emitting layer (including between the substrate and the exterior).

By combining these methods, the present invention enables preparation of the element which exhibits higher luminance and more excellent durability.

In the case where a medium exhibiting a low refractive index is formed at a thickness greater than the wavelength of light between the transparent electrode and the transparent substrate, the lower the refractive index of the medium, the higher the efficiency of extraction of the light, emitted from the transparent electrode, to the outside.

Examples of the medium of the low refractive index layer include aerogel, porous silica, magnesium fluoride, and fluorine based polymers. Since the refractive index of the transparent substrate is commonly about 1.5 to 1.7, the refractive index of the above low refractive index layer is preferably 1.5 or less, and more preferably it is 1.35 or less.

Further, the thickness of the low refractive index medium is preferably at least twice the wavelength in the medium. The reason is that when the thickness of the low refractive index medium is about light wavelength so that electromagnetic wave leaked out via evernescent enters into the substrate, effects of the low refractive index layer are reduced.

A method to introduce a diffraction grating at the interface which results in total reflection or into any of the media is characterized in that increased effects of the light extraction efficiency is high. In the above method, of light generated from the light emitting layer, the light, which is not capable of escaping to the exterior due to total reflection at the boundary between two layers, is diffracted via an introduction of the diffraction grating between any layers or within the medium (in the transparent substrate or the transparent electrode) by utilizing properties of the diffraction grating in which it is possible to change the direction of light to a specified direction differing from diffraction via so-called Bragg diffraction, such as primary diffraction or secondary diffraction, to result in the light being extracted to the outside.

It is preferable that the introduced diffraction grating exhibits a two-dimensional periodical refractive index. Since the light emitting layer randomly emits light in all directions, in a general one-dimensional diffraction grating, which exhibits a cyclic refractive index distribution only in a certain direction, only the light directed to a specified direction is diffracted whereby the light extraction efficiency is not so increased. However, by employing the refractive index of a two-dimensional distribution, the light directing to all directions is diffracted to increase the light extraction efficiency.

The location of the diffraction grating may be, as described above, between any layers or in a medium (in a transparent substrate or a transparent electrode), but a position near the organic light emitting layer where light is emitted is preferred. In such a case, the period of the diffraction grating is preferably about half to about 3 times the wavelength of the light in the medium.

With regard to the arrangement of the diffraction grating, a two-dimensionally repeating arrangement such as a square lattice shape, a triangle lattice shape, or a honeycomb shape is preferred.

<<Light Focusing Sheet>>

In the organic EL element of the present invention, it is possible to enhance luminance in a specified direction by focusing light to the specified direction such as the front direction with regard to the light emitting surface of the element, which can be achieved by processing the element to, for example, provide a microlens array structure or by combining the element with a so-called light focusing sheet on the light extracting side of the substrate.

An example of the above microlens array is that quadrangular pyramids are two-dimensionally arranged on the light extracting side of the substrate in such a manner that one side is 30 μm and the vertex angle is 90 degrees. The side is preferably 10 to 100 μm. In the case where the side is shorter than the above length, undesirable diffraction effects occur to result in unwanted coloration, while in the case where the side is excessively long, the thickness undesirably increases.

As the light focusing sheet, it is possible to employ, for example, those which are currently used in LED backlights of liquid crystal display devices. As an example of such a sheet, the luminance enhancing film (BEF), produced by Sumitomo 3M Co., Ltd, may be employed. As the shape of a prism sheet, examples may include a sheet in which a stripe of triangles is formed on the substrate, which stripe exhibits a vertex angle of 90 degrees and a pitch of 50 μm, or may be a sheet exhibiting shapes such as a rounded vertex, randomly varying pitches, and the like.

Further, to control the radiation angle of light from the light emitting element, a light diffusion plate/film may be combined with the focusing sheet. For example, the light diffusion film (LIGHT-UP), produced by Kimoto Co., Ltd. may be employed.

<<Applications>>

The organic EL element of the present invention may be utilized as a display device, a display, or various light sources. Examples of the use of the light source include lighting device (a home lamp or a room lamp in a car), a backlight for a watch or a liquid crystal, a light source for boarding advertisement, a signal device, a light source for a photo memory medium, a light source for an electrophotographic copier, a light source for an optical communication instrument and a light source for an optical sensor, but are not limited to them. Of these, the element is particularly effectively utilized for a backlight for a liquid crystal display or a light source for lighting use.

The organic EL element of the present invention, if desired, may be subjected to patterning during film making, via a metal mask or an ink-jet printing method. In the case of the patterning, only the electrode may be subjected to the patterning, or both the electrode and the light emitting layer may be subjected to the patterning, or all element layers may be subjected to the patterning. Commonly known conventional methods can be employed for the preparation of the element.

Color of light emitted from the organic EL element of the present invention or the chemical compounds according to the present invention is measured via a spectroradiometer CS-1000 (manufactured by Konica Minolta Sensing Inc.) and the measured values are plotted onto the CIE chromaticity diagram described in FIG. 4.16 on page 108 of "Shinpen Shikisai Kagaku Handbook" (Coloring Science Handbook, New Edition), (edited by Nihon Shikisai Gakkai, published by Todai Shuppan Kai, 1985), whereby the color is determined.

In the case where the organic EL element of the present invention is a white element, the term "white" means that the chromaticity is within a region of $X=0.33\pm0.07$, $Y=0.33\pm0.1$ according to CIE 1931 color coordinate system at 1,000 cd/m$^2$ when a front luminance at a viewing angle of 2 degrees is measured via the above method. In n organic light emitting layer of an organic EL element of the present invention, it is preferable to contain at least one kind of light emitting host compound and at least one kind of light emitting dopant as a guest material.

EXAMPLES

The present invention will now be described with reference to examples, however the present invention is not limited thereto.

In addition, the chemical structures of the compounds used in Examples are shown in the followings.

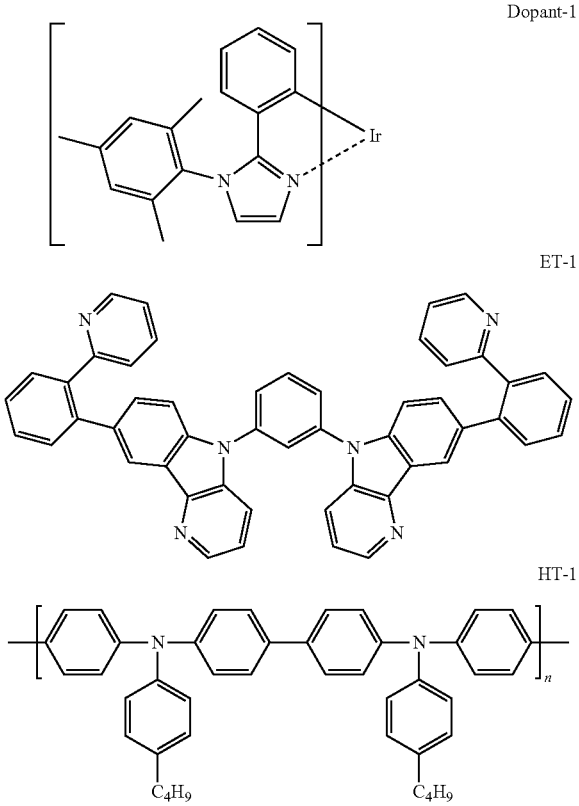

Example 1

<<Preparation of Organic EL Element 101>>

An anode was prepared by making patterning to a PET film of 100 mm×100 mm×0.3 mm (LUMILAR, made by TORAY Industries, Inc.) on which a 100 nm film of ITO (indium tin oxide) was formed. Thereafter, the above transparent support substrate provided with the ITO transparent electrode was subjected to ultrasonic washing with isopropyl alcohol, followed by drying with desiccated nitrogen gas, and was subjected to UV ozone washing for 5 minutes.

On this transparent support substrate thus prepared was applied a 70% solution of poly(3,4-ethylenedioxythiophene)-polystyrene sulfonate (PEDOT/PSS, Baytron P AI 4083 made by Bayer AG.) diluted with water with a spin coating method by adjusting the conditions so that a film thickness became 40 nm.

Then the coated film was dried at 130° C. for one hour to obtain a hole injection layer.

Subsequently, the substrate was fixed in a vacuum deposition apparatus, and the pressure of the vacuum tank was reduced to $4\times10^{-4}$ Pa. Compound HT-1 was vapor deposited to form a hole transport layer. The thickness thereof was made to be 27 nm. Then, in the same vacuum deposition apparatus with keeping the same vacuum degree, there were co-deposited exemplified compound a-1 as a host and a blue emitting dopant compound Dopant-1. The total thickness was controlled to be 43 nm and the ratio of Dopant-1 to the host compound a-1 was made to be 22.3 volume %.

Subsequently, in the same vacuum deposition apparatus with keeping the same vacuum degree, Compound ET-1 was vapor deposited to form a film having a thickness of 32 mm to obtain an electron transport layer. Then, LiF was vapor deposited to form a film having a thickness of 1 nm to obtain an electron injection layer, and aluminium was vapor deposited to form a film having a thickness of 110 nm to obtain a cathode. Thus Organic EL element 101 was prepared.

To finish up, a concave formed sealing member made of glass was pasted to the prepared organic EL element using a cyano acrylate type adhesive to seal the organic EL element.

<<Preparation of Organic EL Element 102>>

In the same manner as preparation of Organic EL element 101, PEDOT/PSS was coated on a transparent resin substrate which had been provided with an ITO film.

Subsequently, the substrate was fixed in a vacuum deposition apparatus, and the pressure of the vacuum tank was reduced to $4\times10^{-4}$ Pa. Compound HT-1 was vapor deposited to form a hole transport layer. The thickness thereof was made to be 27 nm.

Subsequently, a solution of 100 mg of light emitting host compound a-1 and 19 mg of blue emitting dopant compound Dopant-1 dissolved in 10 ml of ethylbenzene was applied with a spin coat method under the condition of forming a film having a thickness of 43 nm after drying. Then, the solvent was evaporated under nitrogen gas at room temperature to obtain a blue emitting layer.

Subsequently, the substrate was fixed in a vacuum deposition apparatus, and the pressure of the vacuum tank was reduced to $4\times10^{-4}$ Pa. In the same manner as preparation of Organic EL element, Compound ET-1 was vapor deposited to form a film having a thickness of 32 nm to obtain an electron transport layer.

Then, LiF was vapor deposited to form a film having a thickness of 1 nm to obtain an electron injection layer, and aluminium was vapor deposited to form a film having a thickness of 110 nm to obtain a cathode. Thus Organic EL element 102 was prepared.

To finish up, a concave formed sealing member made of glass was pasted to the prepared organic EL element using a cyano acrylate type adhesive to seal the organic EL element.

<<Preparation of Organic EL Elements 103 and 104>>

In the preparation of Organic EL element 102, the following change was made. During the step of solvent evaporation under nitrogen gas after coating of a light emitting layer, the drying temperature was increased from room temperature to 75° C. over 2 minutes, then, while monitoring the surface temperature of the coated layer, under the condition of the surface temperature kept to be 75° C., the facing 4 sides of the substrate were applied with a tension of 1.2 N/m and kept for 30 minutes. From the measurement result of surface temperature, it was confirmed that a constant rate drying and a decreasing rate drying were completed during the aforesaid 30 minutes.

In addition, the stress loaded on the substrate was 4.0 kPa when the tension of 1.2 N/m was applied.

Afterward, applying a tension was stopped, and it was added a step of decreasing the temperature over 30 minutes to return to room temperature. Thus, Organic EL element 103 was prepared in the same manner as preparation of Organic EL element 102 except the change shown in Table 1.

Organic EL element 104 was prepared in the same manner as preparation of Organic EL element 103, except that the drying temperature was set to be 90° C., and the surface temperature was kept at 90° C. and the tension was set to be 5.0 N/m.

In addition, the stress loaded on the substrate was 16.6 kPa when the tension of 5.0 N/m was applied.

(Measurement of Yield Stress)

In the preparation of Organic EL element 102, the substrate having been prepared until the hole transport layer was subjected to a stretch test using the following tensile testing machine. As a result, it was found that a yield stress at 90° C. was 200 kPa.

TENSILON Universal Testing Machine RTG-1250 (tensile testing machine: made by A & D Co., Ltd.)

The sample portion was kept warm at 90° C.

Stretching rate: 10 mm/minute

A yield stress at 75° C. was measured in the same manner, and it was found that a yield stress at 75° C. was 4 MPa.

<<Evaluation of Organic EL Element>>

The prepared organic EL elements each were evaluated with respect to external extraction quantum efficiency, driving voltage, and voltage increase of continued driving.

(External Extraction Quantum Efficiency)

The external extraction quantum efficiency (%) was determined when each organic EL element was allowed to emit a light with a constant electric current of 2.5 mA/cm$^2$. The external extraction quantum efficiency can be calculated with the following scheme.

External extraction quantum efficiency(%)=[(Number of photons emitted out of Organic EL element)/ (Number of electrons supplied to Organic EL element)]×100

Here, the measurement was done using a spectroradiometric luminance meter CS-1000 (produced by Konica Minolta Sensing Inc.).

The external extraction quantum efficiencies of Organic EL elements 101 to 104 were represented by the relative value when the measured external extraction quantum efficiency value of Organic EL element 101 was set to be 100 and they were shown in Table 1. The external extraction quantum efficiencies of Organic EL elements 201 to 304 were represented by the relative value when the measured external extraction quantum efficiency value of Organic EL element 201 was set to be 100 and hey were shown in Table 2 and Table 3.

(Driving Voltage)

Each organic EL element was driven with a constant electric current of 2.5 mA/cm$^2$ at room temperature (about 23° C. to 25° C.) and its voltage was measured. A relative value was determined and shown when the voltage value of Organic EL element 101 (comparative examples) was set to be 100.

(Voltage Increase of Continued Driving)

An electric current was applied to the prepared organic EL element so that the front luminance became 2,000 cd/m$^2$, then the organic EL element was continuously driven until the front luminance became the half (1,000 cd/m$^2$) of the initial value. The difference between the terminal driving voltage and the initial driving voltage was determined as a voltage increase of continued driving.

A: voltage increase of continued driving is less than 0.5 V

B: voltage increase of continued driving is 0.5 V or more to less than 1.0 V

C: voltage increase of continued driving is 1.0 V or more to less than 2.0 V

D: voltage increase of continued driving is 2.0 V or more

TABLE 1

| | | Organic EL element | | | |
|---|---|---|---|---|---|
| | | 101 | 102 | 103 | 104 |
| Substrate | Substrate | Resin substrate | Resin substrate | Resin substrate | Resin substrate |
| Hole injection layer | Film forming method | Coating | Coating | Coating | Coating |
| | Compound | PEDOT/PSS | PEDOT/PSS | PEDOT/PSS | PEDOT/PSS |
| | Drying temperature (° C.) | 130 | 130 | 130 | 130 |
| | Drying time (minutes) | 60 | 60 | 60 | 60 |
| Hole transport layer | Film forming method | Vapor deposition | Vapor deposition | Vapor deposition | Vapor deposition |
| | Compound | HT-1 | HT-1 | HT-1 | HT-1 |
| Light emitting layer | Film forming method | Vapor deposition | Coating | Coating | Coating |
| | Compound-1 | Exemplified compound a-1 | Exemplified compound a-1 | Exemplified compound a-1 | Exemplified compound a-1 |
| | Compound-2 | Dopant-1 | Dopant-1 | Dopant-1 | Dopant-1 |
| | Drying temperature (° C.) | — | Room temperature | 75 | 90 |
| | Temperature increasing time (minutes) to drying temperature | — | — | 2 | 2 |
| | Tension during temperature increasing (N/m) | — | — | 0 | 0 |
| | Drying time (minutes) | — | 62 | 30 | 30 |
| | Tension during constant rate drying step (N/m) | — | — | 1.2 | 5 |
| | Tension during decreasing rate drying step (N/m) | — | — | 1.2 | 5 |
| | Temperature decreasing time (minutes) to room temperature | — | — | 30 | 30 |
| | Tension during temperature decreasing (N/m) | — | — | 0 | 0 |
| Electron transport layer | Film forming method | Vapor deposition | Vapor deposition | Vapor deposition | Vapor deposition |
| | Compound | ET-1 | ET-1 | ET-1 | ET-1 |
| Evaluation results | External extraction quantum efficiency (compared with Sample 101) | 100 | 62 | 98 | 99 |
| | Driving voltage (compared with Sample 101) | 100 | 143 | 110 | 108 |
| | Voltage increase of continued driving (compared with Sample 101) | A | D | B | A |
| | Remarks | Comparative example | Comparative example | Present invention | Present invention |

As are shown in Table 1, when an organic layer was laminated with a method including a wet process, the coated film was heated in the solvent evaporation drying process while applying a tension in a manner that a stress of less than a yield stress of the substrate is given to the substrate. Thereby it can obtain the performance of external extraction quantum efficiency, driving voltage and voltage increase of continued driving each being almost the same as exhibited by an element produced by vapor deposition method. Further, by adopting a wet process, it is possible to produce an element with a roll to roll method. Thus, t was shown that high productivity with low cost was achieved.

Example 2

<<Preparation of Organic EL Elements 201 to 204>>

Organic EL element 201 was prepared in the same manner as preparation of Organic EL element 101, except that a light emitting host and a dopant each were replaced with the compounds shown in Table 2 so as to change an emission color to white, and the film thickness was made to be the value shown in Table 2. Further, Organic EL elements 202 to 204 each were prepared in the same manner as preparation of Organic EL elements 102 to 104, except that a light emitting host and a dopant each were replaced with the compounds used in Organic EL element 201 and the film thickness was made to be the value shown in Table 2. In addition, the used amounts of the compounds in the organic light emitting layer were made as follows, exemplified compound a-6: Dopant-1: Ir-1: Ir-4=5:24.2:0.3:0.4 by mass.

<<Evaluation of Organic EL Elements 201 to 204>>

The prepared organic EL elements each were evaluated with respect to the items done in Example 1. The evaluation results are shown in Table 2.

In the element in which the compounds of the organic light emitting layer were changed so as to make the emitting light to be white, when the organic light emitting layer was formed with a wet process, the coated film was heated in the solvent evaporation drying process while applying a tension in a manner that a stress of less than a yield stress of the substrate is given to the substrate as in Example 1. Thereby it can obtain the performance of external extraction quantum efficiency, driving voltage and voltage increase of continued driving each being almost the same as exhibited by an element produced by vapor deposition method. Thus, it was shown that high productivity with low was achieved.

Example 3

<<Preparation of Organic EL Elements 303, 304 and 402>>

Organic EL elements 303 and 304 each were prepared in the same manner as preparation of Organic EL elements 203 and 204, except that no tension was applied during the constant rate drying in the drying step of the organic light emitting layer after coated, and the tension was applied to the 4 sides of the substrate during the decreasing rate drying: 2.8 N/m for Element 303; and 44 N/m for Element 304 as shown in Table 3.

Here, a stress to the substrate becomes 9.3 kPa when a tension of 2.8 N/m is applied, and a stress to the substrate becomes 145 kPa when a tension of 2.8 N/m is applied.

Further, Organic EL element 402 was prepared in the same manner as preparation of Element 203, except that one axis

TABLE 2

| | | Organic EL element | | | |
|---|---|---|---|---|---|
| | | 201 | 202 | 203 | 204 |
| Substrate | Substrate | Resin substrate | Resin substrate | Resin substrate | Resin substrate |
| Hole injection layer | Film forming method | Coating | Coating | Coating | Coating |
| | Compound | PEDOT/PSS | PEDOT/PSS | PEDOT/PSS | PEDOT/PSS |
| | Drying temperature (° C.) | 130 | 130 | 130 | 130 |
| | Drying time (minutes) | 60 | 60 | 60 | 60 |
| Hole transport layer | Film forming method | Vapor deposition | Coating | Coating | Coating |
| | Compound | HT-1 | HT-1 | HT-1 | HT-1 |
| Light emitting layer | Film forming method | Vapor deposition | Coating | Coating | Coating |
| | Film thickness after drying of the formed film (nm) | 54 | 54 | 54 | 54 |
| | Compound-1 | Exemplified compound a-6 | Exemplified compound a-6 | Exemplified compound a-6 | Exemplified compound a-6 |
| | Compound-2 | Dopant-1 | Dopant-1 | Dopant-1 | Dopant-1 |
| | Compound-3 | Ir-1 | Ir-1 | Ir-1 | Ir-1 |
| | Compound-4 | Ir-4 | Ir-4 | Ir-4 | Ir-4 |
| | Drying temperature (° C.) | — | Room temperature | 75 | 90 |
| | Temperature increasing time (minutes) to drying temperature | — | — | 2 | 2 |
| | Tension during temperature increasing (N/m) | — | — | 0 | 0 |
| | Drying time (minutes) | — | 62 | 30 | 30 |
| | Tension during constant rate drying step (N/m) | — | — | 1.2 | 5 |
| | Tension during decreasing rate drying step (N/m) | — | — | 1.2 | 5 |
| | Temperature decreasing time (minutes) to room temperature | — | — | 30 | 30 |
| | Tension during temperature decreasing (N/m) | — | — | 0 | 0 |
| Electron transport layer | Film forming method | Vapor deposition | Vapor deposition | Vapor deposition | Vapor deposition |
| | Compound | ET-1 | ET-1 | ET-1 | ET-1 |
| Evaluation results | External extraction quantum efficiency (compared with Sample 201) | 100 | 54 | 98 | 99 |
| | Driving voltage (compared with Sample 201) | 100 | 168 | 112 | 110 |
| | Voltage increase of continued driving (compared with Sample 201) | A | D | B | A |
| | Remarks | Comparative example | Comparative example | Present invention | Present invention | stretching was made with a tension of 1,500 N/m during a decreasing rate drying so as to stretch in an amount of 2 cm. When Organic EL element 402 was observed with a microscope, it was observed a crack on the coated layer of the light emitting layer and it was not possible to evaluate the element.

Here, a stress to the substrate becomes 5 MPa when a tension of 1,500 N/m is applied, <<Evaluation of Organic EL Elements 203 to 304>>

The prepared organic EL elements each were evaluated with respect to the items done in Example 1. The evaluation results are shown in Table 3.

TABLE 3

| | | Organic EL element | | | |
|---|---|---|---|---|---|
| | | 203 | 204 | 303 | 304 |
| Substrate | Substrate | Resin substrate | Resin substrate | Resin substate | Resin substrate |
| Hole injecion layer | Film forming method | Coating | Coating | Coating | Coating |
| | Compound | PEDOT/PSS | PEDOT/PSS | PEDOT/PSS | PEDOT/PSS |
| | Drying temperature (° C.) | 130 | 130 | 130 | 130 |
| | Drying time (minutes) | 60 | 60 | 60 | 60 |
| Hole transport layer | Film forming method | Coating | Coating | Coating | Coating |
| | Compound | HT-1 | HT-1 | HT-1 | HT-1 |
| Light emitting layer | Film forming method | Coating | Coating | Coating | Coating |
| | Film thickness after drying of the formed film (nm) | 54 | 54 | 54 | 54 |
| | Compound-1 | Exemplified compound a-6 | Exemplified compound a-6 | Exemplified compound a-6 | Exemplified compound a-6 |
| | Compound-2 | Dopant-1 | Dopant-1 | Dopant-1 | Dopant-1 |
| | Compound-3 | Ir-1 | Ir-1 | Ir-1 | Ir-1 |
| | Compound-4 | Ir-4 | Ir-4 | Ir-4 | Ir-4 |
| | Drying temperature (° C.) | 75 | 90 | 75 | 90 |
| | Temperature increasing time (minutes) to drying temperature | 2 | 2 | 2 | 2 |
| | Tension during temperature increasing (N/m) | 0 | 0 | 0 | 0 |
| | Drying time (minutes) | 30 | 30 | 30 | 30 |
| | Tension during constant rate drying step (N/m) | 1.2 | 5 | 0 | 0 |
| | Tension during decreasing rate drying step (N/m) | 1.2 | 5 | 2.8 | 44 |
| | Temperature decreasing time (minutes) to room temperature | 30 | 30 | 30 | 30 |
| | Tension during temperature decreasing (N/m) | 0 | 0 | 2.8 | 44 |
| Electron transport layer | Film forming method | Vapor deposition | Vapor deposition | Vapor deposition | Vapor deposition |
| | Compound | ET-1 | ET-1 | ET-1 | ET-1 |
| Evaluation results | External extraction quantum efficiency (compared with Sample 201) | 98 | 99 | 113 | 109 |
| | Driving voltage (compared with Sample 201) | 112 | 110 | 94 | 90 |
| | Voltage increase of continued driving (compared with Sample 201) | B | A | A | A |
| | Remarks | Present invention | Present invention | Present invention | Present invention |

From the results in Table 3, it is shown that Elements 303 and 304, which were applied tension during the decreasing rate drying, are superior to Elements 203 and 204.

Example 4

Each film density of the organic light emitting layer in Elements 201 to 204, 304 and 305 was measured.

The film density was determined with an X ray reflection method for the sample which was provided till the light emitting layer. Copper was used as a target for an X ray source, and it was driven with 50 kV-300 mA. It was used a monochrome X ray produced with a multi-layered mirror and Ge (111) channel cut monochromator. The measurement was done using a software ATX-Crystal Guide Ver. 6.5.3.4. After making halved and adjusting alignment, it was scanned at a speed of 0.05 degree/mini with 0.002 degree/step in the range of 2θ/ω=0 to 1. The reflection curve was measured with the aforesaid measuring conditions. Then, it was used an analytic software GXRR Ver. 2.1.0 (made by Rigaku Corporation). The values obtained by subtracting the film density of Elements 202 to 204, 303 and 304 from the film density of Element 201 were determined as a film density difference. The results are shown in Table 4

TABLE 4

| | Organic EL element | | | | | |
|---|---|---|---|---|---|---|
| | 201 | 202 | 203 | 204 | 303 | 304 |
| Film density difference of Light emitting layer (compared with Sample 201) | 0 | +0.18 | +0.11 | +0.07 | +0.02 | −0.01 |
| Remarks | Comparative example | Comparative example | Present invention | Present invention | Present invention | Present invention |

From the results shown in Table 4, it was found the following. Compared with the film density of the organic light emitting layer of Organic EL element 201, which was produced with a vapor deposition method, the film density of the organic light emitting layer of Organic EL element 202 was fairly low. Organic EL element 202 was produced without applying heat and tension during the evaporation step of the coating solvent for the organic light emitting layer. On the contrary, Organic EL elements 203 and 204, which were produced with applying heat and tension, exhibited small film density difference. In particular, Organic EL elements 303 and 304, which were produced with applying tension only during the decreasing rate drying step, exhibited further smaller film density difference. It was found that the film density of these elements is almost the same as a vapor deposition film.

The invention claimed is:

1. A producing method of an organic electroluminescence element having a substrate, an organic laminated body containing an organic light emitting layer which is produced with a wet process, and a pair of electrodes, the producing method comprising the steps of:

applying a coating solution of the organic light emitting layer to the substrate, thereafter drying the organic light emitting layer by heating the substrate while applying a tension to the substrate in a manner that a stress of less than a yield stress of the substrate is given to the substrate, wherein a film density (A) of the organic light emitting layer and a film density (B) of a layer produced by vapor depositing the same material used for the organic light emitting layer satisfy the following scheme, $-0.02$ g/cm3$\leq$(B)$-$(A)$\leq$0.15 g/cm3.

2. The producing method of an organic electroluminescence element of claim 1, wherein the drying step contains a constant rate drying step and a decreasing rate drying step, the tension is not given to the substrate during the constant rate drying step, and the tension is given to the substrate during the decreasing rate drying step in a manner that a stress of less than a yield stress of the substrate is given to the substrate.

3. The producing method of an organic electroluminescence element of claim 1, wherein the tension to the substrate is applied in two axis directions.

4. The producing method of an organic electroluminescence element of claim 1, wherein the applied tension is in the range of 0.01 N/m to 50 N/m.

5. The producing method of an organic electroluminescence element of claim 1, wherein the stress is 0.33 to 165 kPa.

6. The producing method of an organic electroluminescence element of claim 1, wherein a film density (A) of the organic light emitting layer and a film density (B) of a layer produced by vapor depositing the same material used for the organic light emitting layer satisfy the following scheme, $-0.02$ g/cm3$\leq$(B)$-$(A)$\leq$0.06 g/cm3.

7. The producing method of an organic electroluminescence element of claim 1, wherein the substrate contains a material which exhibits flexibility.

* * * * *